(12) United States Patent
Sawadaishi et al.

(10) Patent No.: US 9,877,004 B2
(45) Date of Patent: Jan. 23, 2018

(54) COLOR-MIXTURE-RATIO CALCULATION DEVICE AND METHOD, AND IMAGING DEVICE

(71) Applicant: FUJIFILM Corporation, Tokyo (JP)

(72) Inventors: Arito Sawadaishi, Saitama (JP); Hayato Yamashita, Saitama (JP)

(73) Assignee: FUJIFILM Corporation, Tokyo (JP)

( * ) Notice: Subject to any disclaimer, the term of this patent is extended or adjusted under 35 U.S.C. 154(b) by 61 days.

(21) Appl. No.: 14/939,549

(22) Filed: Nov. 12, 2015

(65) Prior Publication Data
US 2016/0065925 A1    Mar. 3, 2016

Related U.S. Application Data

(63) Continuation of application No. PCT/JP2014/060861, filed on Apr. 16, 2014.

(30) Foreign Application Priority Data

May 13, 2013   (JP) .................................. 2013-101486

(51) Int. Cl.
*H04N 9/64*   (2006.01)
*H04N 9/04*   (2006.01)
(Continued)

(52) U.S. Cl.
CPC ....... *H04N 9/646* (2013.01); *H01L 27/14621* (2013.01); *H04N 5/3591* (2013.01); *H04N 9/045* (2013.01)

(58) Field of Classification Search
CPC ........ H04N 9/045; H04N 9/646; H04N 9/735; H04N 5/3572; H04N 5/359; H04N 5/3696;
(Continued)

(56) References Cited

U.S. PATENT DOCUMENTS 8,558,925 B2 * 10/2013 Yamauchi ............ H04N 5/3572
                                                    348/246
8,890,981 B2 * 11/2014 Kasai ..................... H04N 9/045
                                                    348/231.99
(Continued)

FOREIGN PATENT DOCUMENTS

JP    2009-188461 A    8/2009
JP    2010-16419 A     1/2010
JP    2012-95061 A     5/2012

OTHER PUBLICATIONS

International Search Report issued in PCT/JP2014/060861 dated Jul. 22, 2014.
(Continued)

*Primary Examiner* — Michael Osinski
(74) *Attorney, Agent, or Firm* — Birch, Stewart, Kolasch & Birch, LLP

(57) ABSTRACT

When a color-filter-array of a color-imaging-element is a Bayer-array, outputs of pixels prior to color-mixture correction are acquired from the color imaging element when red light is incident onto the color-imaging-element through a photography optical system, the outputs of the green pixels adjacent to the red pixels, among the acquired outputs of each pixel, are regarded as components of color mixture caused by the red pixels, and ratios of color mixture are calculated. In a central portion of an imaging surface of the color-imaging-element, ratios of color mixture, which do not depend on directions of the color mixture caused by the red pixels, are calculated. In end portions of the imaging surface of the color-imaging-element, separate ratios of color mixture according to the directions of the color mixture caused by the red pixels are respectively calculated. The calculated ratios of color mixture are subjected to interpolation calculation.

20 Claims, 29 Drawing Sheets

(51) Int. Cl.
*H04N 5/359* (2011.01)
*H01L 27/146* (2006.01)

(58) Field of Classification Search
CPC ........ H04N 5/347; H04N 5/363; H04N 5/372;
H04N 5/374; H04N 5/3591; H01L
27/14621; H01L 27/14623; H01L
27/14625; H01L 27/14645; G06T 3/4015;
G06T 5/001
See application file for complete search history.

(56) References Cited

U.S. PATENT DOCUMENTS

| | | | | |
|---|---|---|---|---|
| 8,970,741 | B2* | 3/2015 | Yamashita | H04N 5/23209 348/241 |
| 8,988,547 | B2* | 3/2015 | Fukunaga | H04N 5/3572 348/222.1 |
| 9,029,751 | B2* | 5/2015 | Nakata | H04N 5/359 250/208.1 |
| 9,236,943 | B2* | 1/2016 | Ma | H04B 10/071 |
| 9,300,937 | B2* | 3/2016 | Lim | H04N 9/735 |
| 9,317,897 | B2* | 4/2016 | Yamanaka | H04N 5/378 |
| 9,363,491 | B2* | 6/2016 | Kawai | H04N 9/045 |
| 9,380,230 | B2* | 6/2016 | Sawadaishi | H04N 5/3572 |
| 9,584,743 | B1* | 2/2017 | Lin | H04N 5/3696 |
| 2008/0291296 | A1* | 11/2008 | Oike | H04N 5/3591 348/234 |
| 2011/0058072 | A1* | 3/2011 | Wang | H04N 5/3572 348/242 |
| 2011/0102635 | A1 | 5/2011 | Fukunaga et al. | |
| 2011/0134288 | A1* | 6/2011 | Kasai | H04N 9/045 348/241 |
| 2012/0105688 | A1 | 5/2012 | Kita | |
| 2014/0078349 | A1* | 3/2014 | Velichko | H04N 5/359 348/241 |
| 2015/0015749 | A1* | 1/2015 | Ito | H01L 27/14629 348/273 |
| 2015/0103216 | A1* | 4/2015 | Kurahashi | H04N 5/217 348/280 |
| 2015/0237273 | A1* | 8/2015 | Sawadaishi | H04N 5/3572 348/234 |
| 2015/0244926 | A1* | 8/2015 | Inoue | G02B 7/34 348/350 |
| 2015/0271461 | A1* | 9/2015 | Hayashi | H04N 9/07 348/223.1 |
| 2015/0326838 | A1* | 11/2015 | Kawai | H04N 9/045 348/280 |
| 2016/0080713 | A1* | 3/2016 | Tanaka | H04N 9/045 348/242 |
| 2016/0080715 | A1* | 3/2016 | Tanaka | H04N 5/3696 348/223.1 |
| 2016/0381336 | A1* | 12/2016 | Akahane | H04N 5/21 348/239 |

OTHER PUBLICATIONS

Written Opinion of the International Searching Authority issued in PCT/JP2014/060861 dated Jul. 22, 2014.
International Preliminary Report on Patentability and the English translation of the Written Opinion of the International Searching Authority, dated Nov. 17, 2015, for International Application No. PCT/JP2014/060861.

* cited by examiner

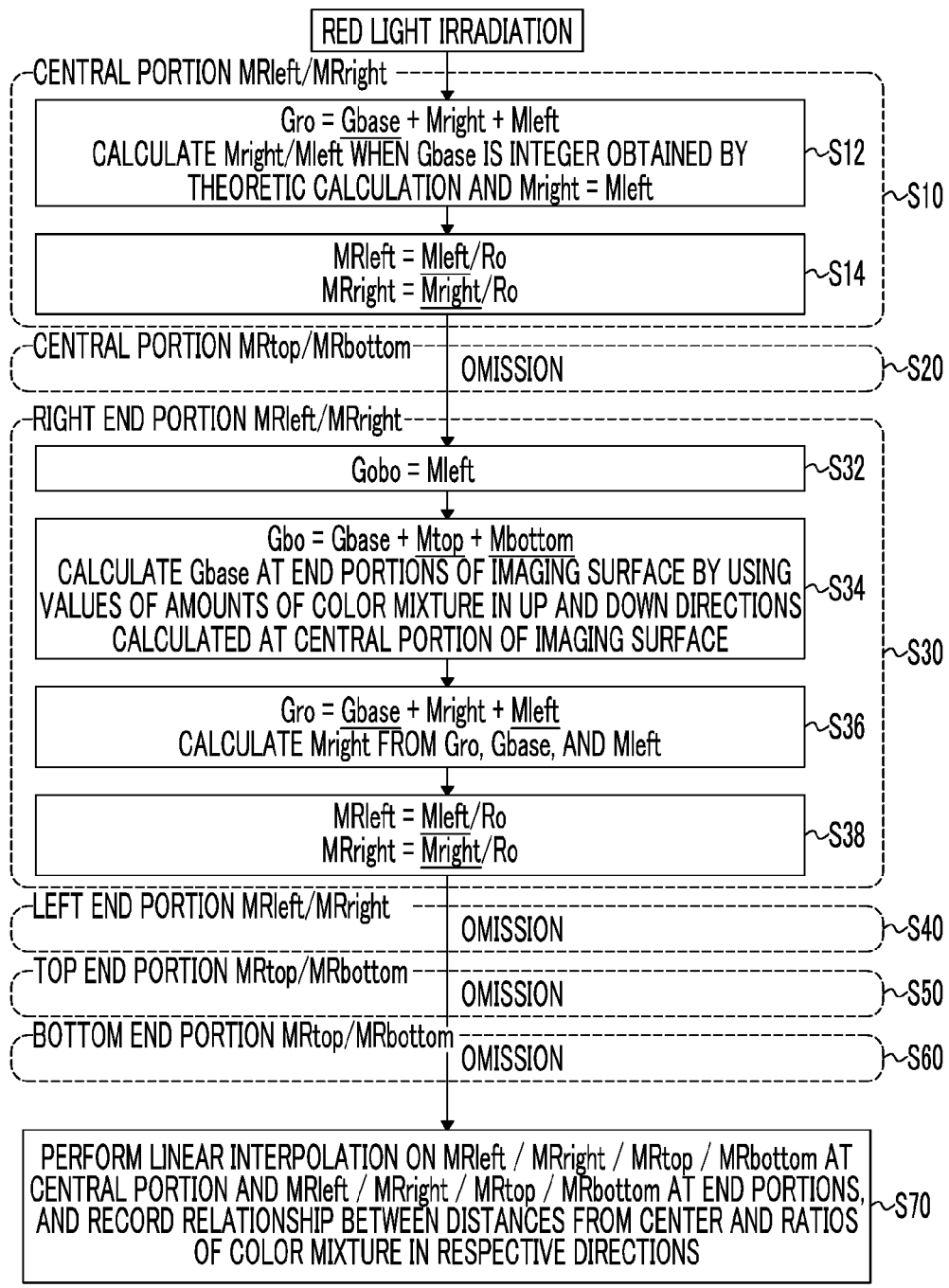

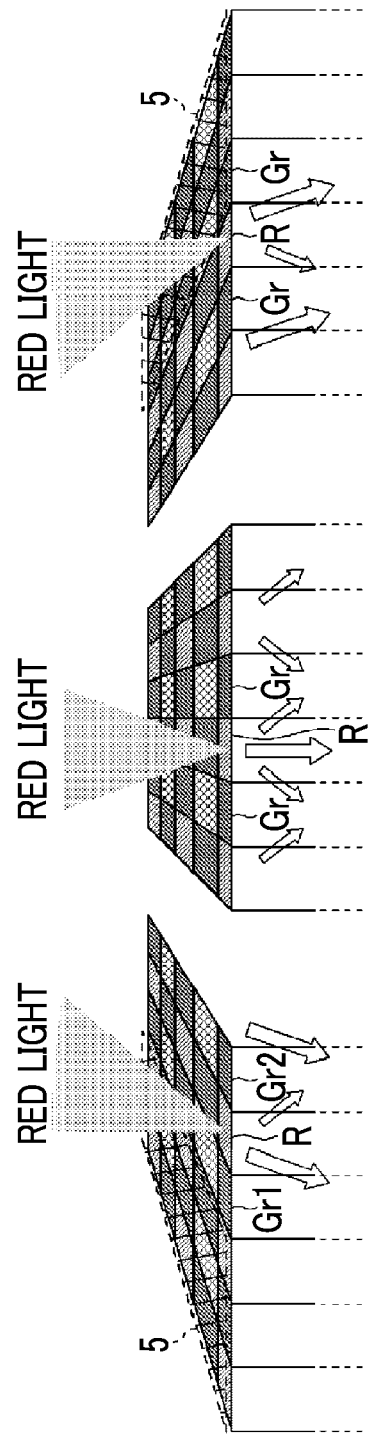

FIG. 19

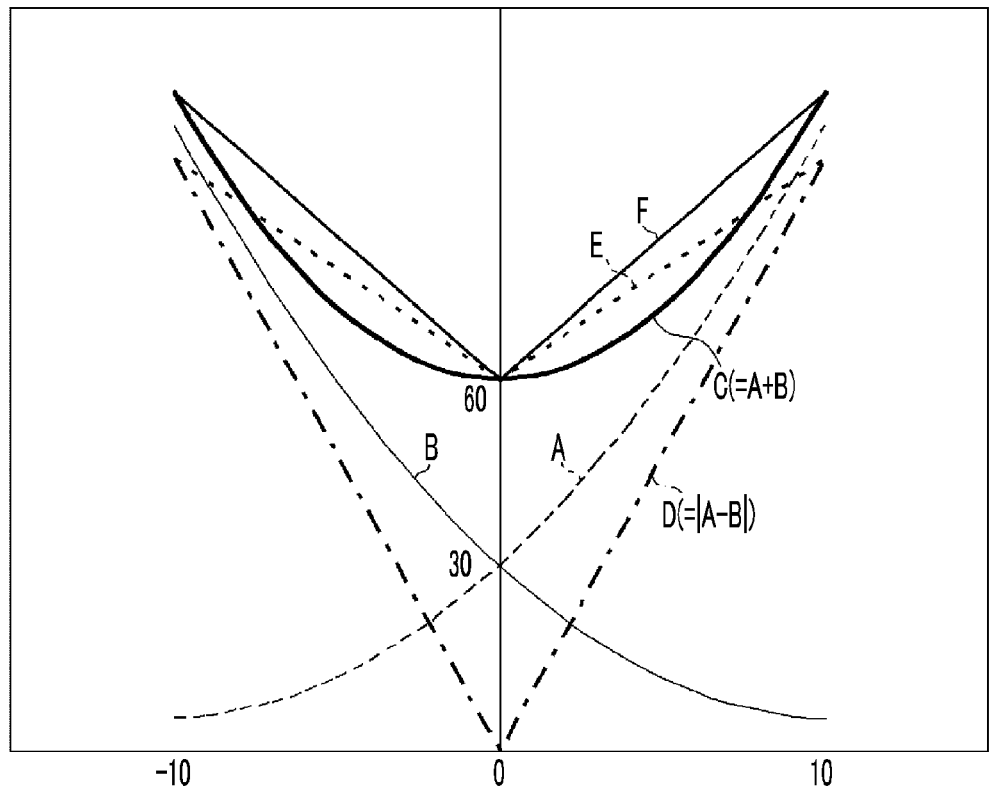

| A | - - - - | COLOR MIXTURE FROM LEFT SIDE TO RIGHT SIDE |
| B | —— | COLOR MIXTURE FROM RIGHT SIDE TO LEFT SIDE |
| C | —— | AMOUNT OF CORRECTABLE COLOR MIXTURE BASED ON NEW CORRECTION METHOD 2 AND TOTAL AMOUNT OF COLOR MIXTURE |
| D | — - - | AMOUNT OF CORRECTABLE COLOR MIXTURE BASED ON RELATED ART |
| E | - - - - | AMOUNT OF CORRECTABLE COLOR MIXTURE BASED ON COMBINATION OF RELATED ARTS |
| F | —— | AMOUNT OF CORRECTABLE COLOR MIXTURE BASED ON NEW CORRECTION METHOD 1 |

FIG. 20

| | COLOR MIXTURE A FROM LEFT SIDE TO RIGHT SIDE | COLOR MIXTURE B FROM RIGHT SIDE TO LEFT SIDE | AMOUNT OF CORRECTABLE COLOR MIXTURE C BASED ON NEW CORRECTION METHOD 2 AND TOTAL AMOUNT OF COLOR MIXTURE | AMOUNT OF CORRECTABLE COLOR MIXTURE D BASED ON RELATED ART | AMOUNT OF CORRECTABLE COLOR MIXTURE E BASED ON COMBINATION OF RELATED ARTS | AMOUNT OF CORRECTABLE COLOR MIXTURE F BASED ON NEW CORRECTION METHOD 1 |
|---|---|---|---|---|---|---|
| -10 | 5.407 | 100.953 | 106.36 | 95.546 | 95.546 | 106.36 |
| -9 | 5.7801 | 91.7715 | 97.5516 | 85.9914 | 91.9914 | 101.724 |
| -8 | 6.6168 | 83.0536 | 89.6704 | 76.4368 | 88.4368 | 97.088 |
| -7 | 7.9171 | 74.7993 | 82.7164 | 66.8822 | 84.8822 | 92.452 |
| -6 | 9.681 | 67.0086 | 76.6896 | 57.3276 | 81.3276 | 87.816 |
| -5 | 11.9085 | 59.6815 | 71.59 | 47.773 | 77.773 | 83.18 |
| -4 | 14.5996 | 52.818 | 67.4176 | 38.2184 | 74.2184 | 78.544 |
| -3 | 17.7543 | 46.4181 | 64.1724 | 28.6638 | 70.6638 | 73.908 |
| -2 | 21.3726 | 40.4818 | 61.8544 | 19.1092 | 67.1092 | 69.272 |
| -1 | 25.4545 | 35.0091 | 60.4636 | 9.5546 | 63.5546 | 64.636 |
| 0 | 30 | 30 | 60 | 0 | 60 | 60 |
| 1 | 35.0091 | 25.4545 | 60.4636 | 9.5546 | 63.5546 | 64.636 |
| 2 | 40.4818 | 21.3726 | 61.8544 | 19.1092 | 67.1092 | 69.272 |
| 3 | 46.4181 | 17.7543 | 64.1724 | 28.6638 | 70.6638 | 73.908 |
| 4 | 52.818 | 14.5996 | 67.4176 | 38.2184 | 74.2184 | 78.544 |
| 5 | 59.6815 | 11.9085 | 71.59 | 47.773 | 77.773 | 83.18 |
| 6 | 67.0086 | 9.681 | 76.6896 | 57.3276 | 81.3276 | 87.816 |
| 7 | 74.7993 | 7.9171 | 82.7164 | 66.8822 | 84.8822 | 92.452 |
| 8 | 83.0536 | 6.6168 | 89.6704 | 76.4368 | 88.4368 | 97.088 |
| 9 | 91.7715 | 5.7801 | 97.5516 | 85.9914 | 91.9914 | 101.724 |
| 10 | 100.953 | 5.407 | 106.36 | 95.516 | 95.546 | 106.36 |

FIG. 23

| | COLOR MIXTURE A FROM LEFT SIDE TO RIGHT SIDE AT LARGE $\theta$ | COLOR MIXTURE B FROM LEFT SIDE TO RIGHT SIDE AT SMALL $\theta$ |
|---|---|---|
| -10 | 0 | 35.406 |
| -9 | 0 | 35.8138 |
| -8 | 0 | 36.227 |
| -7 | 0 | 36.6456 |
| -6 | 0 | 37.0696 |
| -5 | 0 | 37.499 |
| -4 | 3.2 | 37.9338 |
| -3 | 8.8 | 38.374 |
| -2 | 16.8 | 38.8196 |
| -1 | 27.2 | 39.2706 |
| 0 | 40 | 39.727 |
| 1 | 55.2 | 40.1888 |
| 2 | 72.8 | 40.656 |
| 3 | 92.8 | 41.1286 |
| 4 | 115.2 | 41.6066 |
| 5 | 140 | 42.09 |
| 6 | 167.2 | 42.5788 |
| 7 | 196.8 | 43.073 |
| 8 | 228.8 | 43.5726 |
| 9 | 263.2 | 44.0776 |
| 10 | 300 | 44.588 |

AT F2.0, INCIDENCE ANGLE RANGE $\phi$ IS ±20°

AT F2.0, INCIDENCE ANGLE
RANGE φ IS ±20°

ND METHOD, AND IMAGING
COLOR-MIXTURE-RATIO CALCULATION DEVICE AND METHOD, AND IMAGING DEVICE

CROSS-REFERENCE TO RELATED APPLICATIONS

This application is a Continuation of PCT International Application No. PCT/JP2014/060861 filed on Apr. 16, 2014, which claims priority under 35 U.S.C §119(a) to Japanese Patent Application No. 2013-101486 filed May 13, 2013. Each of the above application(s) is hereby expressly incorporated by reference, in its entirety, into the present application.

BACKGROUND OF THE INVENTION

1. Field of the Invention

The present invention relates to a color-mixture-ratio calculation device, a color-mixture-ratio calculation method, and an imaging device, and particularly relates to a technology of calculating ratios of color mixture with high accuracy.

2. Description of the Related Art

In progress in miniaturization of pixels of an imaging element of a digital camera, there is a problem of color mixture. The color mixture occurs after light is incident from adjacent pixels onto a silicon surface in a complementary metal oxide semiconductor (CMOS) imaging element.

As shown in FIG. 26, the color mixture depends on an incidence angle. Thus, in order to precisely correct color mixture, it is necessary to provide different parameters (ratio of color mixture) in accordance with a position within an imaging surface of a color imaging element 1, an incidence angle $\theta$ of incidence from a lens 2 in which the angle changes depending on a focal length, and an incidence angle range $\varphi$ which changes depending on an aperture stop value (F number). Further, color mixture is caused by complex phenomena such as a phenomenon in which pixels causing color mixture are also affected by color mixture caused by adjacent pixels. Thus, it is difficult to measure an amount of color mixture (ratio of color mixture) caused by the adjacent pixels.

The color mixture depends on a wavelength. Thus, in particular, there is a problem of color mixture caused by red pixels through which long wavelength light as a dominant component deeply penetrates to a position under the silicon surface.

FIG. 27A is a plan view of a color imaging element having a primary-color Bayer array as a color filter array (CF array) most widely used in a single-plate-type color imaging element. FIG. 27B is a sectional view of a principal section taken along line 27b-27b of FIG. 27A.

As shown in FIG. 27B, in the color imaging element having the Bayer array, green (G) pixels have a checkered pattern shape (checker flag shape), and red (R) and blue (B) pixels are alternately arranged for each line. Hence, light incident into the R pixels penetrates to the positions under the silicon surface in the G pixels which are vertically and horizontally adjacent to the R pixels. As a result, color mixture occurs.

FIG. 28A is a plan view of a color imaging element having a new color filter array (new CF array) recently proposed by present applicants. FIG. 28B is a sectional view of a principal section taken along the line 28b-28b of FIG. 28A.

As shown in FIG. 28A, in the new CF array, basic array patterns based on units of 6×6 pixels are repeatedly arranged in the horizontal direction and the vertical direction.

[Related Art 1]

In the past, in the color imaging elements having the Bayer array, as a method for estimating an amount of color mixture, particularly, there is a method of making red light, which tends to cause color mixture since the light reaches the deepest position under the silicon surface, incident and setting an output difference between pixels, which are present at right and left positions or upper and lower positions of a red pixel, as an amount of color mixture. For example, in a case of the left position within the imaging surface shown in FIG. 29A, assuming that outputs of G pixels at the left and right of an R pixel are respectively G-LL and G-LR, an amount of color mixture is represented as (G-LL)-(G-LR). Likewise, in a case of the right position within the imaging surface shown in FIG. 29C, assuming that outputs of G pixels at the left and right of an R pixel are respectively G-RL and G-RR, an amount of color mixture is represented as (G-RR)-(G-RL).

However, at the central portion within the imaging surface shown in FIG. 29B, assuming that outputs of G pixels at the left and right of an R pixel are respectively G-CL and G-CR, an amount of color mixture is ideally represented as G-CL=G-CR. As a result, color mixture is regarded as zero for the purpose of calculation. The reason for this is that an incidence angle range $\varphi$ of an incidence angle $\theta\pm$ the incidence angle range $\varphi$ shown in FIG. 26 is not considered. In practice, at the central portion within the imaging surface (at F2.0), light is incident in an incidence angle range of 0±20°, color mixture occurs symmetrically in the vertical and horizontal directions, but this cannot be estimated in this method.

At the left position within the imaging surface, in the output G-LR of the G pixel on the right side of the R pixel, even when color mixture of light incident from the right side, or color mixture from the right side is eliminated in order from the central portion, color mixture from the opposite side is not considered.

If the incidence angle $\theta$ is large (in a case of non-telecentric wide-angle lens or the like), color mixture from the opposite side is sufficiently small. Thus, even in a conventional method, the above-mentioned problem does not appear. However, in a case of a lens through which light is vertically incident onto the entire imaging surface, correction therefor becomes insufficient.

[Related Art 2]

There is a known method for the correction. In this method, even at the central portion of the imaging surface, it is possible to perform correction in the following manner: not the output difference between the adjacent pixels on the left and right sides or the upper and lower sides but the outputs of the adjacent pixels obtained when pure red light is incident are regarded as indicating color mixture. In this method, the directions of the color mixture cannot be determined. Hence, by applying a ratio of color mixture to an average of the outputs of both of the left and right or upper and lower red pixels, calculation of color mixture from left and right or upper and lower adjacent pixels is performed. As a result, a problem arises in that a weak lowpass effect is exerted on an image in which the color mixture is corrected and this adversely affects resolution thereof.

As a method of performing the correction without adversely affecting the resolution, the following correction method based on a combination of related arts can be adopted. At the central portion of the imaging surface, the outputs of the adjacent pixels, which are obtained when pure red light is incident, are regarded as indicating color mixture, thereby calculating a ratio of color mixture. In addition, at the peripheral portions, in a manner similar to the conventional method, calculation of the ratio of color mixture is performed using the difference between the left and right sides, and linear interpolation is performed on a region between the central portion and the peripheral portion. In such a manner, it is possible to use a correction method based on a combination of related arts. However, this method is also not satisfactory since color mixture from the opposite side is regarded as zero at the peripheral portions.

JP2012-95061A describes the following technology. In an imaging element having image generation pixels and other specific pixels (white pixels or phase difference detection pixels which do not have color filters), only blue light or red light is emitted, and only light caused by color mixture is received by the image generation pixels, whereby, a color-mixture correction coefficient (ratio of color mixture) is calculated.

JP2010-16419A describes the following technology. When R single color light is emitted, response amounts (signal amounts) of G and B pixels are set as amounts of color mixture from adjacent R pixels, whereby ratios of color mixture of the R pixels to the G and B pixels are calculated. Likewise, when G single color light or B single color light is emitted, ratios of color mixture of the G pixels to the R and B pixels are calculated, or ratios of color mixture of the B pixels to the R and G pixels are calculated (in JP2010-16419A, the paragraphs "0084" to "0087").

JP2010-16419A also describes the following technology. A color-mixture correction coefficient for each of a plurality of regions, which are divided to correspond to the imaging surface of the imaging element, is stored, a ratio of color mixture at a necessary pixel position is acquired by approximating the color-mixture correction coefficient, which is stored at the time of color mixture correction, through interpolation, and a color mixture component is corrected using the acquired ratio of color mixture.

In the description of JP2009-188461A, red light on the long wavelength side does not attenuate, and thus an amount of color mixture is large (in JP2009-188461A, the paragraph "0006"). Further, storage means stores a correction function depending on an aperture stop value or a zoom position, and a color-mixture correction coefficient is multiplied by a value calculated from the correction function, whereby color mixture correction is performed (in JP2009-188461A, claim 3).

SUMMARY OF THE INVENTION

However, the invention described in JP2012-95061A cannot be applied to a color imaging device, which has no specific pixels, since it is the premise that an imaging element has the image generation pixels having color filters and other specific pixels (white pixels or phase difference detection pixels which do not have color filters). Further, the specific pixels described in JP2012-95061A are arranged continuously in the left and right directions of the imaging element. Hence, it is not possible to calculate ratios of color mixture in the left and right directions by using the specific pixels.

The invention described in JP2010-16419A corresponds to "Related Art 2" mentioned above. Thus, it is not possible to calculate a separate ratio of color mixture for each of the up and down or left and right directions of the color mixture.

In the description of JP2009-188461A, the amount of color mixture is changed by a distance from an optical center or the vertical and horizontal directions of the imaging element. However, there is no description about a technique of providing the separate ratio of color mixture for each of directions of the color mixture among the left and right or up and down directions on the imaging surface. Further, there is also no detailed description about a method of calculating the ratio of color mixture.

The present invention has been made in consideration of these situations. An object of the invention is to provide a color-mixture-ratio calculation device, a color-mixture-ratio calculation method, and an imaging device capable of respectively calculating separate ratios of the color mixture caused by the adjacent red pixels according to the directions of the color mixture and thereby capable of performing highly accurate color mixture correction.

In order to achieve the above-mentioned object, according to one aspect of the present invention, there is provided a color-mixture-ratio calculation device that calculates ratios of color mixture of a single-plate-type color imaging element having color pixels of at least three colors of red, green, and blue. The color-mixture-ratio calculation device includes: an acquisition section that acquires outputs of pixels prior to color-mixture correction from the color imaging element when red light is incident onto the color imaging element through a photography optical system; and a color-mixture-ratio calculation section that calculates the ratios of color mixture when outputs of pixels adjacent to red pixels among the outputs of the pixels acquired by the acquisition section are regarded as components of color mixture caused by the red pixels. The color-mixture-ratio calculation section calculates the ratio of color mixture independent of the directions of the color mixture caused by the red pixels at least at a central portion of an imaging surface of the color imaging element, and respectively calculates the separate ratios of color mixture according to the directions of the color mixture caused by the red pixels at end portions of the imaging surface of the color imaging element.

According to the aspect of the present invention, in order to calculate ratios of color mixture from red pixels to other color pixels, outputs of pixels prior to color-mixture correction are acquired from the color imaging element when red light is incident onto the color imaging element through a photography optical system. The red pixels are pixels through which long wavelength light as a dominant component deeply penetrates into an element structure of the color imaging element. Among the acquired outputs of the pixels, the outputs of the pixels adjacent to the red pixels are regarded as components of color mixture caused by the red pixels. In this case, at the central portion of the imaging surface of the color imaging element, an incidence angle of the red light is zero. Hence, the ratio of color mixture independent of the directions of the color mixture caused by the red pixels is calculated. At the end portions of the imaging surface of the color imaging element, the ratios of color mixture are different in accordance with the directions of the color mixture caused by the red pixels. Hence, the separate ratios of color mixture according to the directions of the color mixture are respectively calculated.

In the color-mixture-ratio calculation device according to another aspect of the present invention, it is preferable that the color imaging element has green pixels which are adjacent to the red pixels and are arranged symmetrically in the directions of the color mixture. In addition, it is preferable that the color-mixture-ratio calculation section calculates the ratio of color mixture, on the basis of outputs of the red pixels at the central portion of the imaging surface and outputs of the green pixels adjacent to the corresponding red pixels, and calculates the separate ratios of color mixture according to the directions of the color mixture at the end portions of the imaging surface, on the basis of outputs of the red pixels at the end portions of the imaging surface and outputs of the green pixels adjacent to the corresponding red pixels, outputs of pixels of an optical black section adjacent to the red pixels of the color imaging element, or outputs of the green pixels adjacent to the optical black section.

The green pixels are adjacent to the red pixels, and are arranged symmetrically in the directions of the color mixture. At the central portion of the imaging surface, there is no directivity in the color mixture. Hence, the ratio of color mixture at the central portion of the imaging surface (the ratio of color mixture independent of the directions of the color mixture) can be calculated on the basis of the outputs of the red pixels at the central portion of the imaging surface and the outputs of the green pixels adjacent to the red pixels. At the end portions of the imaging surface of the color imaging element, when the red pixels are adjacent to the optical black section, the ratio of color mixture in a direction, which is the same as a direction toward a position where the optical black section is provided, can be calculated on the basis of the outputs of the red pixels at the end portions of the imaging surface and outputs of the pixels of the optical black section. In addition, the ratio of color mixture in a direction, which is opposite to the direction toward the position where the optical black section is provided, can be calculated on the basis of the outputs of the red pixels at the end portions of the imaging surface and a value which is obtained by subtracting the outputs of the pixels of the optical black section from the outputs of the green pixels. In contrast, when the green pixels are adjacent to the optical black section, the ratio of color mixture in the direction, which is the same as the direction toward the position where the optical black section is provided, can be calculated on the basis of the outputs of the red pixels at the end portions of the imaging surface and the outputs of the green pixels adjacent to the optical black section. In addition, the ratio of color mixture in the direction, which is opposite to the direction toward the position where the optical black section is provided, can be calculated on the basis of the outputs of the red pixels at the end portions of the imaging surface and a difference between outputs of two green pixels interposing the red pixel.

In the color-mixture-ratio calculation device according to another aspect of the present invention, it is preferable that the color imaging element has green pixels, which are adjacent to the red pixels and are arranged symmetrically in the directions of the color mixture, and a red pixel for the color-mixture-ratio calculation which has an opening in an optical black section. In addition, it is preferable that the color-mixture-ratio calculation section calculates the ratio of color mixture at the central portion of the imaging surface, on the basis of outputs of the red pixels at the central portion of the imaging surface and outputs of the green pixels adjacent to the corresponding red pixels, and calculates the separate ratios of color mixture according to the directions of the color mixture at the end portions of the imaging surface, on the basis of an output of the red pixel for the color-mixture-ratio calculation and outputs of the pixels adjacent to the corresponding red pixel for the color-mixture-ratio calculation in the optical black section.

The pixels of the optical black section, each of which is adjacent to the red pixel for color-mixture-ratio calculation, is affected by color mixture which is only caused by the red pixel for color-mixture-ratio calculation. Hence, the separate ratios of color mixture according to the directions of the color mixture can be calculated on the basis of the output of the red pixel for color-mixture-ratio calculation and the outputs of the pixels of the optical black section each of which is adjacent to the red pixel for color-mixture-ratio calculation.

In the color-mixture-ratio calculation device according to another aspect of the present invention, it is preferable that the color-mixture-ratio calculation section has an interpolation processing section which calculates the separate ratios of color mixture according to the directions of the color mixture for each segmented region or for each pixel position of the imaging surface through interpolation, on the basis of the calculated ratios of color mixture at the central portion of the imaging surface and the calculated separate ratios of color mixture according to the directions of the color mixture at the end portions of the imaging surface. The interpolation processing section performs linear interpolation on the ratio of color mixture at the central portion of the imaging surface and the separate ratios of color mixture according to the directions of the color mixture at the end portions of the imaging surface. Thereby, it is possible to calculate the separate ratios of color mixture according to the directions of the color mixture for each pixel position of the imaging surface or for each segmented region. Further, without limitation to the linear interpolation, quadratic interpolation may be performed on the ratio of color mixture on the basis of the ratio of color mixture at the central portion of the imaging surface and the ratios of color mixture at both end portions of the imaging surface, thereby calculating a ratio of color mixture at an intermediate position.

In the color-mixture-ratio calculation device according to another aspect of the present invention, it is preferable that the color imaging element has different color pixels which are not the red pixels and are adjacent to the red pixels and to which the red pixels are adjacent only in any one of a plurality of the directions of the color mixture. In addition, it is preferable that the color-mixture-ratio calculation section calculates the ratio of color mixture from the direction in which the red pixels are adjacent, at each pixel position of the different color pixels, on the basis of an output of the color pixel at the corresponding pixel position and an output of one red pixel adjacent to the corresponding color pixel.

The red pixel is adjacent to the different color pixel in only any one of the plurality of the directions of the color mixture. The output of the different color pixel can be regarded as a component of color mixture caused by one adjacent red pixel. Accordingly, it is possible to calculate the ratio of color mixture from a direction in which the red pixel is adjacent, on the basis of the outputs of the different color pixels and the output of one adjacent red pixel.

In the color-mixture-ratio calculation device according to another aspect of the present invention, it is preferable that the color imaging element has blue pixels which are adjacent to the red pixels and to which the red pixels are adjacent only in any one of the plurality of the directions of the color mixture. Wavelength bands having spectral transmittance characteristics of the red pixels and the blue pixels are separated from the respective wavelength bands of the red pixels and the green pixels. Hence, the ratio of color mixture can be accurately calculated from the outputs of the red pixels and the blue pixels.

In the color-mixture-ratio calculation device according to another aspect of the present invention, it is preferable that the plurality of the directions of the color mixture is four directions in which the pixels on the color imaging element are adjacent at the shortest distance. When the pixels of the color imaging element are arranged in a square lattice shape, the four directions, in which the pixels are adjacent at the shortest distance, are up, down, left, and right directions. When the pixels of the color imaging element are arranged in a diagonal lattice shape, the four directions, in which the pixels are adjacent at the shortest distance, are a diagonal upper right direction, a diagonal lower right direction, a diagonal upper left direction, and a diagonal lower left direction.

The color-mixture-ratio calculation device according to another aspect of the present invention further includes a photography condition setting section that changes at least either one of a focal length or an F number of an aperture stop of the photography optical system. In the device, it is preferable that the acquisition section acquires the outputs of the pixels prior to color-mixture correction from the corresponding color imaging element when red light is incident onto the color imaging element, whenever a photography condition is changed by the photography condition setting section. In addition, it is preferable that the color-mixture-ratio calculation section calculates the ratios of color mixture on the basis of the outputs of the pixels acquired by the acquisition section whenever the photography condition is changed by the photography condition setting section. The ratio of color mixture changes depending on photography conditions (an F number and a focal length). Hence, it is preferable to calculate the separate ratios of color mixture according to the photography conditions.

According to another aspect of the present invention, there is provided an imaging device including: an image capturing section that includes the photography optical system and the color imaging element; a storage section that stores ratios of color mixture calculated by the color-mixture-ratio calculation device; and a color mixture correction section that calculates color mixture components on the basis of the ratios of color mixture stored in the storage section and outputs of pixels prior to color-mixture correction acquired from the color imaging element at the time of photography so as to remove the color mixture components calculated from the outputs of the pixels prior to color-mixture correction. By using the separate ratios of color mixture according to the directions of the color mixture stored in the storage section, color mixture correction is performed. Hence, it is possible to perform highly accurate color mixture correction.

According to another aspect of the present invention, there is provided an imaging device including: an image capturing section that includes the photography optical system and the color imaging element; a storage section that stores ratios of color mixture, which are calculated by the color-mixture-ratio calculation device, in association with a photography condition which is set by the photography condition setting section; a color mixture correction section that reads the corresponding ratios of color mixture from the ratios of color mixture stored in the storage section on the basis of the photography condition at the time of photography, and calculates color mixture components on the basis of the read ratios of color mixture outputs of pixels prior to color-mixture correction acquired from the color imaging element at the time of the corresponding photography so as to remove the color mixture components calculated from the outputs of the pixels prior to color-mixture correction. By using the separate ratios of color mixture according to the directions of the color mixture stored in the storage section, that is, the ratios of color mixture corresponding to the photography conditions at the time of photography, color mixture correction is performed. Hence, it is possible to perform highly accurate color mixture correction.

According to another aspect of the present invention, there is provided an imaging device including: an image capturing section that includes the photography optical system and the color imaging element; the color-mixture-ratio calculation device; a storage section that stores ratios of color mixture calculated by the color-mixture-ratio calculation device at the time of ratio of color mixture setting; and a color mixture correction section that calculates color mixture components on the basis of the ratios of color mixture stored in the storage section and outputs of pixels prior to color-mixture correction acquired from the color imaging element at the time of photography so as to remove the color mixture components calculated from the outputs of the pixels prior to color-mixture correction.

According to another aspect of the present invention, there is provided an imaging device including: an image capturing section that includes the photography optical system and the color imaging element; the color-mixture-ratio calculation device; a storage section that stores ratios of color mixture, which are calculated by the color-mixture-ratio calculation device at the time of ratio of color mixture setting, in association with a photography condition which is set by the photography condition setting section; and a color mixture correction section that reads the corresponding ratios of color mixture from the ratios of color mixture stored in the storage section on the basis of the photography condition at the time of photography, and calculates color mixture components on the basis of the read ratios of color mixture outputs of pixels prior to color-mixture correction acquired from the color imaging element at the time of the corresponding photography so as to remove the color mixture components calculated from the outputs of the pixels prior to color-mixture correction.

In the imaging device according to another aspect of the present invention, it is preferable that the photography optical system is an interchangeable lens. In addition, it is preferable that the color-mixture-ratio calculation device calculates the ratios of color mixture at the time of mounting at least a new interchangeable lens.

According to another aspect of the present invention, there is provided a color-mixture-ratio calculation method of calculating ratios of color mixture of a single-plate-type color imaging element having color pixels of at least three colors of red, green, and blue. The color-mixture-ratio calculation method includes: a step of making red light incident onto the color imaging element through a photography optical system; an acquisition step of acquiring outputs of pixels prior to color-mixture correction from the color imaging element; and a color-mixture-ratio calculation step of calculating the ratios of color mixture when outputs of pixels adjacent to red pixels among the outputs of the pixels acquired through the acquisition step are regarded as components of color mixture caused by the red pixels. In the color-mixture-ratio calculation step, the ratio of color mixture independent of the directions of the color mixture caused by the red pixels is calculated at least at a central portion of an imaging surface of the color imaging element, and respectively calculates the separate ratios of color mixture according to the directions of the color mixture caused by the red pixels at end portions of the imaging surface of the color imaging element.

The color-mixture-ratio calculation method according to another aspect of the present invention further includes a photography condition setting step of changing at least either one of a focal length or an F number of an aperture stop of the photography optical system. In the method, it is preferable that, in the acquisition step, the outputs of the pixels prior to color-mixture correction are acquired from the corresponding color imaging element when red light is incident onto the color imaging element, whenever a photography condition is changed through the photography condition setting step. In addition, it is preferable that in the color-mixture-ratio calculation step, the ratios of color mixture are calculated on the basis of the outputs of the pixels acquired through the acquisition step whenever the photography condition is changed through the photography condition setting step.

According to the present invention, the ratios of the color mixture caused by the adjacent red pixels can be respectively calculated in accordance with the directions of the color mixture. By using the separate ratios of color mixture according to the directions of the color mixture at the time of color mixture correction, color mixture correction is performed. Hence, it is possible to perform highly accurate color mixture correction.

BRIEF DESCRIPTION OF THE DRAWINGS

FIG. 4 is a flowchart illustrating a procedure of calculation of ratios of color mixture according to a color-mixture-ratio calculation method of a first embodiment.

FIGS. 5A, 5B, and 5C are respectively conceptual diagrams illustrating color mixture from R pixels to G pixels, which are adjacent in the left and right directions, at the left end portion, the central portion, and the right end portion of the color imaging element having the Bayer array.

FIG. 19 is a graph illustrating an amount of color mixture from the R pixel on the left side to the pixel on the right side, an amount of color mixture from the R pixel on the right side to the pixel on the left side, an amount of color mixture which can be corrected through new correction methods 1 and 2, and an amount of color mixture which can be corrected through the related art, when uniform red light is incident onto a surface of the color imaging element.

FIG. 20 is a table showing numerical value data of A to F of the graph shown in FIG. 19.

FIG. 23 is a table showing numerical value data of A and B of the graph shown in FIG. 22.

DESCRIPTION OF THE PREFERRED EMBODIMENTS

Hereinafter, embodiments of a color-mixture-ratio calculation device, a color-mixture-ratio calculation method, and an imaging device according to the present invention will be described with reference to the accompanying drawings.

[Color-Mixture-Ratio Calculation Device]

Figure 1:
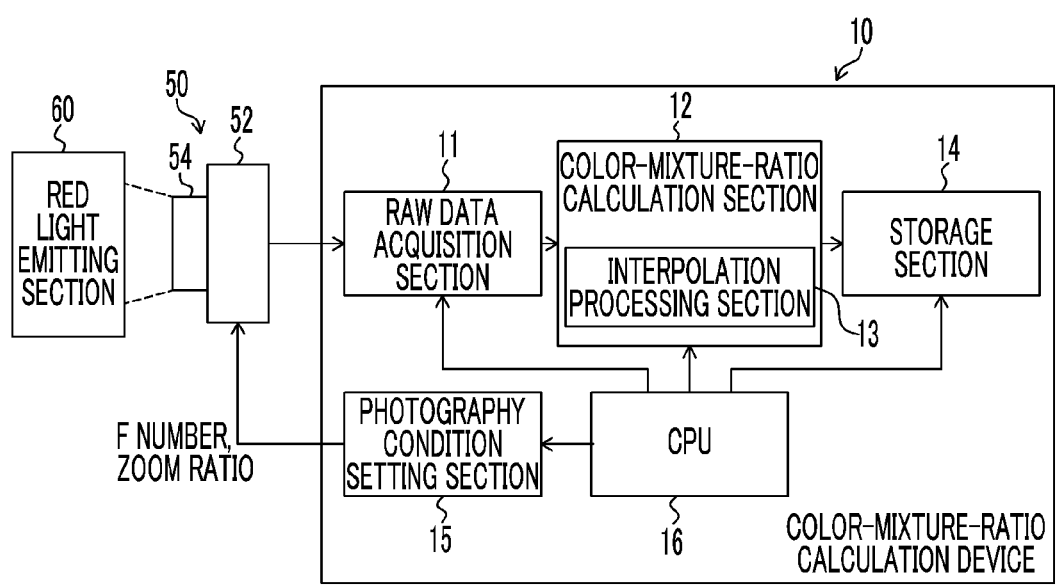
FIG. 1 is a block diagram illustrating an embodiment of a color-mixture-ratio calculation device according to the present invention.

FIG. 1 is a block diagram illustrating an embodiment of a color-mixture-ratio calculation device according to the present invention.

As shown in FIG. 1, a color-mixture-ratio calculation device 10 mainly includes a RAW data acquisition section 11, a color-mixture-ratio calculation section 12, a storage section 14, a photography condition setting section 15, and a central processing unit (CPU) 16.

The color-mixture-ratio calculation device 10 calculates a ratio of color mixture for each imaging device 50 before shipment of the imaging device 50 such as a digital camera. The ratio of color mixture calculated by the color-mixture-ratio calculation device 10 is stored in a storage section within the imaging device 50.

Figure 27A:
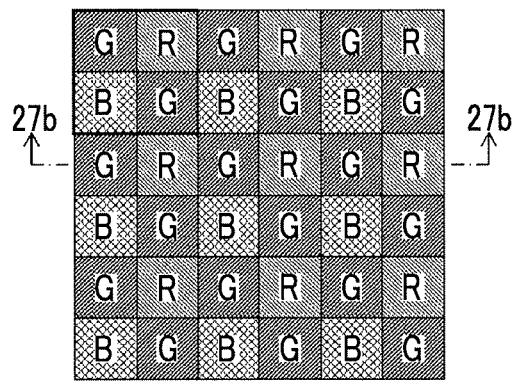
FIG. 27A is a plan view of a color imaging element having the primary-color Bayer array.
Figure 27B:
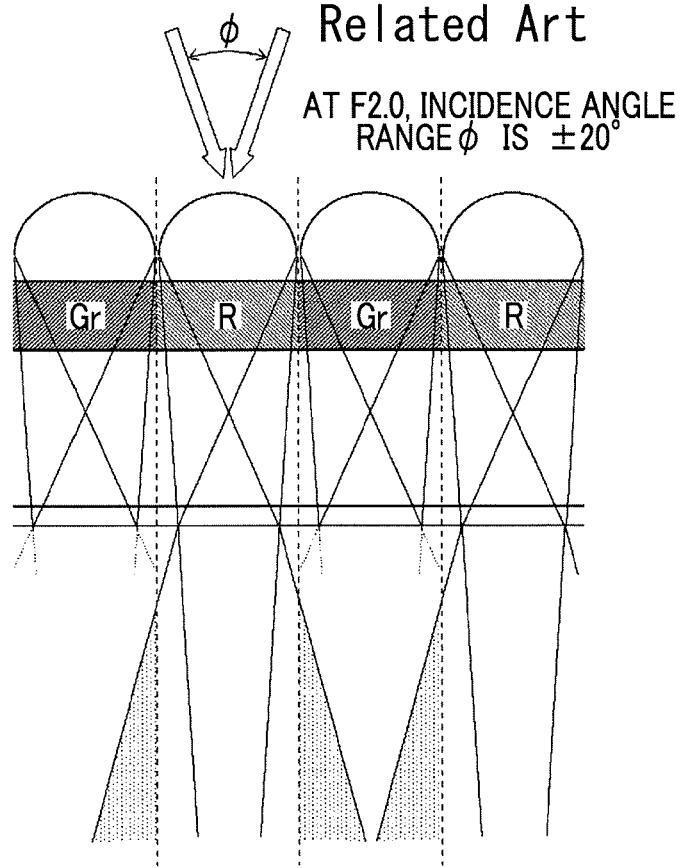
FIG. 27B is a sectional view of a main section taken along line 27b-27b of FIG. 27A.
Figure 28A:
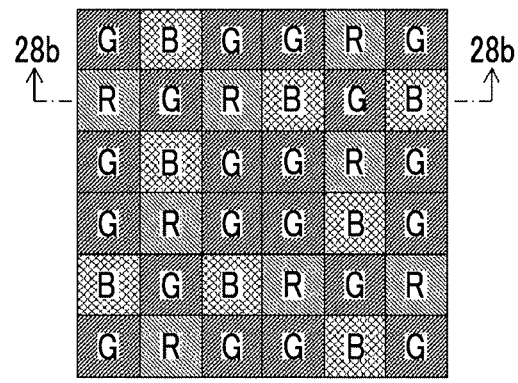
FIG. 28A is a plan view of a color imaging element having a new color filter array.
Figure 28B:
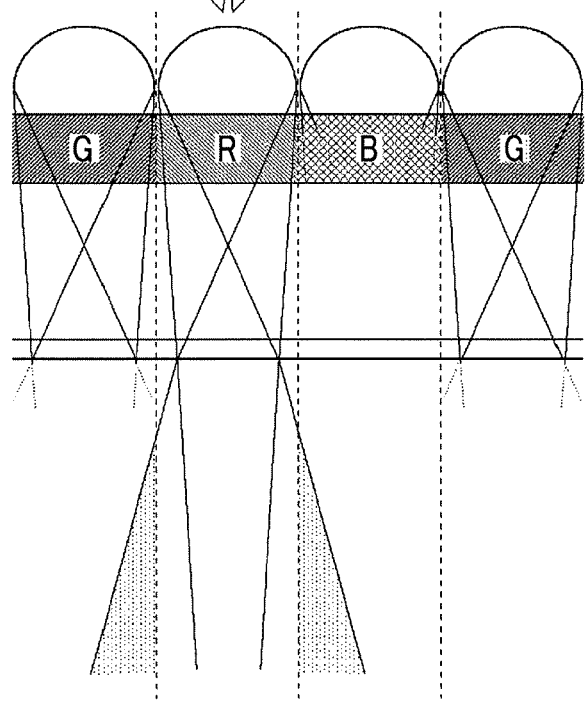
FIG. 28B is a sectional view of a main section taken along line 28b-28b of FIG. 28A.

The imaging device 50 includes a single-plate-type color imaging element having the Bayer array shown in FIG. 27A or the new color filter array (new CF array) shown in FIG. 28A. The color imaging element photoelectrically converts subject light which is imaged on an imaging surface through a photography lens 200, and outputs mosaic image data corresponding to the color filter array. A signal processing section within the imaging device performs signal processing on the unprocessed mosaic image data (RAW data) which is output from the color imaging element. The signal processing includes offset (dark current) correction, color mixture correction, white balance correction, gamma correction, demosaic processing (synchronization processing) of calculating information of all colors for each pixel from the mosaic image, and RGB/YC conversion processing of converting the RGB image data subjected to demosaic processing into luminance data (Y) and color difference data (Cr, Cb).

When the color-mixture-ratio calculation device 10 calculates the ratio of color mixture, the imaging device 50 captures an image of a light emitting surface (light emitting surface that emits red light uniform in the light emitting surface) of a red light emitting section 60.

The CPU 16 provided in the color-mixture-ratio calculation device 10 integrally controls the respective sections of the color-mixture-ratio calculation device 10 in order to perform acquisition of data necessary for calculation of the ratio of color mixture and calculation and recording of the ratio of color mixture and the like on the basis of a command signal for starting color-mixture-ratio calculation from an operation section which is not shown.

The RAW data acquisition section 11 of the color-mixture-ratio calculation device 10 is an acquisition section that acquires RAW data which is an output of the color imaging element of the imaging device 50 when an image of the light emitting surface of the red light emitting section 60 is captured, and outputs the acquired RAW data to the color-mixture-ratio calculation section 12. Here, the RAW data is unprocessed data which is output from the color imaging element, and includes data of an optical black section (OB section) to be described later and data of an effective pixel region of the color imaging element in this example.

The color-mixture-ratio calculation section 12 calculates the separate ratios of color mixture from the R pixel to the different color pixel according to the directions of the color mixture, on the basis of the RAW data which is input from the RAW data acquisition section 11. In addition, the color-mixture-ratio calculation method will be described later in detail.

The color-mixture-ratio calculation section 12 has an interpolation processing section 13. When the color imaging element of the imaging device 50 has the Bayer array, the interpolation processing section 13 interpolates the ratios of color mixture calculated at the central portion of the imaging surface of the color imaging element and the end portions of the imaging surface, and calculates interpolation of the ratios of color mixture between the central portion of the imaging surface and the end portions of the imaging surface.

The storage section 14 temporarily stores the ratios of color mixture, which are calculated by the color-mixture-ratio calculation section 12, in association with the imaging device 50. After the end of the calculation of the ratios of color mixture, the color-mixture-ratio calculation device 10 or a recording device, which records data into the imaging device 50, records the ratios of color mixture, which are stored in the storage section 14, in a nonvolatile memory (storage section) such as a flash memory or an electrically erasable programmable read-only memory (EEPROM) within the imaging device 50.

The photography condition setting section 15 sets and changes an F number of an aperture stop of the imaging device 50 and a zoom ratio of the photography lens 20 on the basis of an instruction issued from the CPU 16. The ratio of color mixture changes depending on the F number and the zoom ratio. Hence, the photography condition setting section 15 sets and changes the F number and the zoom ratio in order to calculate the ratio of color mixture corresponding to each combination of the F numbers and the zoom ratios of a plurality of stages. Further, whenever the F number and the zoom ratio are set and changed, the imaging device 50 captures an image of the light emitting surface of the red light emitting section 60. In addition, in a case where the photography lens 20 of the imaging device 50 is a single focus lens, the photography condition setting section 15 changes only the F number.

First Embodiment

A first embodiment of the present invention is an embodiment of a color-mixture-ratio calculation method applied to the color imaging element having the Bayer array.

As shown in FIG. 27A, the color imaging element having the Bayer array is configured such that units of 2×2 pixels of red (R), green (G), and blue (B) color pixels are repeatedly arranged in the horizontal and vertical directions (the left and right directions and the up and down directions). Accordingly, the pixels affected by color mixture from the R pixel are G pixels which are adjacent to the R pixel at the shortest distance in the up and down and left and right directions.

Figure 2A:
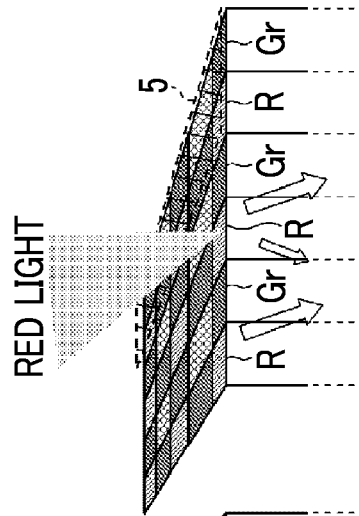
FIGS. 2A, 2B, and 2C are respectively conceptual diagrams illustrating color mixture from R pixels to G pixels, which are adjacent in the left and right directions, at the left end portion, the central portion, and the right end portion of the color imaging element having the Bayer array.
Figure 2B:
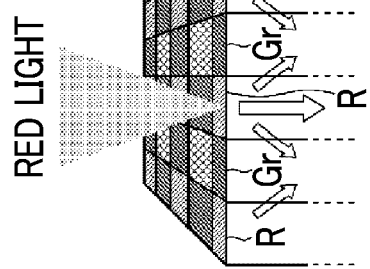
Figure 2C:
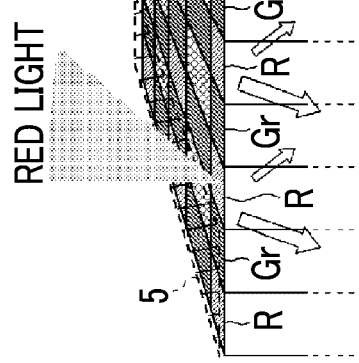

FIGS. 2A, 2B, and 2C are respectively conceptual diagrams illustrating color mixture from R pixels to G pixels, which are adjacent in the left and right directions, at the left end portion, the central portion, and the right end portion of the color imaging element having the Bayer array. In FIG. 2, each arrow direction (diagonal direction) indicates the direction of the color mixture, and each thickness of the arrow conceptually indicates the magnitude of the amount of color mixture.

Figure 3A:
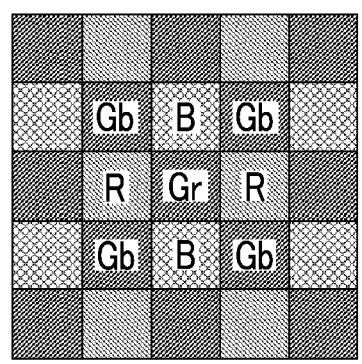
FIGS. 3A and 3B are respectively plan views of main sections at the central portion and the right end portion of the color imaging element having the Bayer array.
Figure 3B:
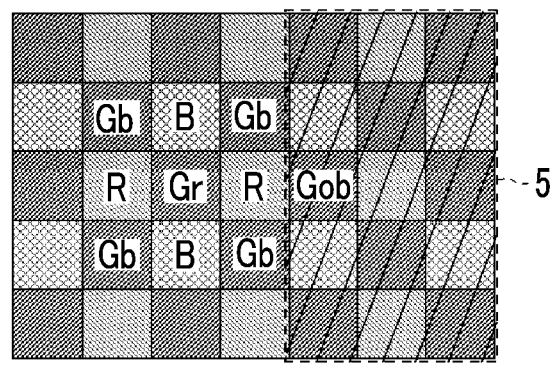

FIGS. 3A and 3B are respectively plan views of main sections at the central portion and the right end portion of the color imaging element having the Bayer array. In FIGS. 3A and 3B, among the G pixels, the G pixel, which is adjacent to the R pixels in the left and right directions, are referred to as Gr, and the G pixels, which are adjacent to the B pixels in the left and right directions, are referred to as Gb.

At the central portion of the imaging surface, it is assumed that the amount of color mixture of the G pixel (Gr) from the R pixel on the left side is Mleft, and the amount of color mixture of the G pixel (Gr) from the R pixel on the right side is Mright. Under the assumption, an output Gro of the G pixel (Gr) can be represented by the following expression.

$$Gro = Gbase + Mright + Mleft \quad \text{[Numerical Expression 1]}$$

Here, the Gbase is a value corresponding to red light transmitted through a G filter as a result of partial overlap between a transmission wavelength region of the G filter of the G pixel and a wavelength region of the red light. The Gbase can be logically calculated from an intensity of the red light, a transmittance of the red light through the G filter, and photoelectric conversion efficiency.

Now, if red light with a short wavelength is incident onto the imaging surface of the color imaging element, as shown in FIG. 2B, at the central portion of the imaging surface, an incidence angle θ of incidence of the red light into the R pixel is zero. Here, color mixture from the R pixels to the adjacent G pixels (Gr) does not depend on the directions of the color mixture.

Accordingly, in Numerical Expression 1, the amounts of color mixture (Mleft and Mright) from the left and right sides of the G pixel (Gr) are equal (Mleft=Mright). Further, since the Gbase is known, at the central portion of the imaging surface, the amounts of color mixture (Mleft and Mright) from the left and the right can be calculated from the output Gro of the G pixel (Gr) by using the following expression.

$$Mleft = Mright = (Gro - Gbase)/2 \quad \text{[Numerical Expression 2]}$$

At the central portion of the imaging surface, assuming that the ratios of color mixture from the left and right sides of the G pixel (Gr) are MRleft and MRright, the ratios of color mixture MRleft and MRright can be calculated, on the basis of an output Ro of the pixel R at the central portion of the imaging surface and the calculated amounts of color mixture (Mleft and Mright) from the left and the right, by using the following expression.

$$MRleft = Mleft/Ro$$

$$MRright = Mright/Ro \quad \text{[Numerical Expression 3]}$$

As described above, at the central portion of the imaging surface, the amounts of color mixture (Mleft and Mright) from the left and the right are equal. Hence, the ratios of color mixture (MRleft and MRright) from the left and the right are represented by Numerical Expression 3.

Meanwhile, an optical black section (OB section) 5 is used in calculation of the ratios of color mixture at the end portions of the imaging surface. The OB section 5 is a portion covered by a light blocking member that is provided around (four sides) of the effective pixel region of the color imaging element so as to optically block light.

Hereinafter, a description will be given of a method of calculating the separate ratios of color mixture according to the directions (left and right directions) of the color mixture at the right end portion of the imaging surface.

As shown in FIG. 3B, assuming that an output of a pixel (Gob) of the OB section 5 adjacent to the right side of the R pixel is Gobo, in the output Gobo of the pixel (Gob), the amount of color mixture (Mleft) from the R pixel on the left side is represented as the output Gobo of the pixel (Gob). Hence, the output Gobo of the pixel (Gob) indicates the amount of color mixture (Mleft) as it is (Gobo=Mleft).

Meanwhile, the Gbase of the G pixel (Gr), prior to calculation of the amount of color mixture from the R pixel on the right side to the G pixel (Gr) adjacent to the left side of the R pixel, is calculated as follows.

First, assuming that an output of a G pixel (Gb) adjacent to the OB section 5 is Gbo, the output Gbo can be represented by the following expression.

$$Gbo = Gbase + Mtop + Mbottom$$

$$Gbase = Gbo - (Mtop + Mbottom) \quad \text{[Numerical Expression 4]}$$

Here, the Mtop and Mbottom indicate the amounts of color mixture from the upper and lower R pixels to the G pixel (Gb). The amounts of color mixture (Mtop and Mbottom) can be calculated as amounts of color mixture (Mtop and Mbottom) from the upper and lower sides at the central portion of the imaging surface, in a manner similar to the above-mentioned amounts of color mixture (Mleft and Mright) from the left and the right at the central portion of the imaging surface, and these values can be used.

Accordingly, the Gbase of the G pixel (Gb) at the end portion of the imaging surface (right end portion) can be calculated from Numerical Expression 4 on the basis of the output Gbo of the G pixel (Gb) and the above-mentioned amounts of color mixture (Mtop and Mbottom).

Assuming that the amount of color mixture from the R pixel on the right side to the G pixel (Gr) adjacent to the left side of the R pixel at the end portion of the imaging surface (right end portion) is Mright and the output of the G pixel (Gr) is Gro, the output Gro of the G pixel (Gr) can be represented by the following expression.

$$Gro = Gbase + Mright + Mleft$$

$$Mright = Gro - Gbase - Mleft \quad \text{[Numerical Expression 5]}$$

Accordingly, the amount of color mixture Mright from the R pixel on the right side can be calculated, on the basis of the above-mentioned Numerical Expression 5, from the output Gro of the G pixel (Gr), the amount of color mixture (Mleft) detected using the output Gobo of the pixel (Gob), and the Gbase calculated by the above-mentioned Numerical Expression 4.

Then, at the right end portion of the imaging surface, assuming that the ratios of color mixture from the left and right sides of the G pixel (Gr) are MRleft and MRright, the ratios of color mixture MRleft and MRright can be calculated, on the basis of the output Ro of the pixel R at the right end portion of the imaging surface and the calculated amounts of color mixture (Mleft and Mright) from the left and the right, by using the above-mentioned Numerical Expression 3.

In a manner as described above, the following can also be calculated: the ratios of color mixture (MRleft and MRright) from the left and right sides of the G pixel (Gr) at the left end portion of the imaging surface; the ratios of color mixture (MRtop and MRbottom) from the upper and lower sides of the G pixel (Gb) at the top end portion of the imaging surface; and the ratios of color mixture (MRtop and MRbottom) from the upper and lower sides of the G pixel (Gb) at the bottom end portion of the imaging surface.

As described above, the separate ratios of color mixture according to the directions of the color mixture at the central portion of the imaging surface and the end portions of the imaging surface can be calculated. Hence, the separate ratios of color mixture according to the directions of the color mixture between the central portion of the imaging surface and the end portions of the imaging surface can be calculated by performing linear interpolation or quadratic interpolation on the ratio of color mixture at the central portion of the imaging surface and the separate ratios of color mixture according to the directions of the color mixture at the end portions of the imaging surface.

FIG. 4 is a flowchart illustrating a procedure of calculation of ratios of color mixture according to a color-mixture-ratio calculation method of the first embodiment, and mainly indicates processing contents of the color-mixture-ratio calculation section 12 shown in FIG. 1.

The imaging device 50 as a target of the color-mixture-ratio calculation has the color imaging element having the Bayer array, and receives only red light emitted from the red light emitting section 60, and outputs RAW data corresponding to an amount of the received light.

The color-mixture-ratio calculation section 12 inputs the RAW data through the RAW data acquisition section 11, and performs the following processing shown in FIG. 4, on the basis of the input RAW data.

First, at the central portion of the imaging surface of the color imaging element, the separate ratios of color mixture according to the directions of the color mixture (according to the left and right directions) from the R pixels to the G pixel (Gr) are calculated (step S10).

In calculation of the ratio of color mixture at the central portion of the imaging surface, first, data Gro of the G pixel (Gr) corresponding to the central portion of the imaging surface is extracted from the RAW data, and the amounts of color mixture (Mleft and Mright) from the left and right sides of the G pixel (Gr) are calculated on the basis of the data Gro (step S12). The amounts of color mixture (Mleft and Mright) can be calculated using the above-mentioned Numerical Expression 1 (Numerical Expression 2).

Subsequently, the data (Ro) of the R pixel, which is adjacent to the left side or the right side of the G pixel (Gr) at the central portion of the imaging surface, is extracted from the RAW data, and each of the calculated amounts of color mixture (Mleft and Mright) is divided by the data Ro of the R pixel in step S12. Thereby, the ratios of color mixture (MRleft and MRright) from the left and right sides of the G pixel (Gr) at the central portion of the imaging surface are calculated (step S14, refer to Numerical Expression 3). In addition, as the data Ro of the R pixel, an average value of data of the two R pixels, which are adjacent to the left side and the right side of the G pixel (Gr) at the central portion of the imaging surface, may be used.

In a manner as described above, the data Gbo of the G pixel (Gb) at the central portion of the imaging surface and the data (Ro) of the R pixel, which is adjacent to the upper side or the lower side of the G pixel (Gb), are extracted from the RAW data. On the basis of the data of the pixels, the ratios of color mixture (MRtop and MRbottom) from the upper and lower sides of the G pixel (Gb) at the central portion of the imaging surface are calculated (step S20).

Next, at the right end portion of the imaging surface of the color imaging element, the separate ratios of color mixture according to the directions of the color mixture (according to the left and right directions) from the R pixels to the G pixel (Gr) are calculated (step S30).

In calculation of the ratios of color mixture at the right end portion of the imaging surface, first, the data Gobo of the pixel (Gob) of the OB section 5, which is adjacent to the R pixel at the right end portion of the imaging surface, is extracted from the RAW data (refer to FIG. 3B). On the basis of the data Gobo, the amount of color mixture (Mleft=Gobo) from the left side of the G pixel (Gr) at the right end portion of the imaging surface is calculated (step S32).

Subsequently, the Gbase of the G pixel (Gr) at the right end portion of the imaging surface is calculated on the basis of the data Gbo of the G pixel (Gb) adjacent to the OB section 5 and the amounts of color mixture (Mtop and Mbottom) from the upper and lower R pixels of the G pixel (Gb) (step S34, refer to Numerical Expression 4). Then, the data Gro of the G pixel (Gr) at the right end portion of the imaging surface is extracted from the RAW data. On the basis of the data Gro, the amount of color mixture (Mleft) calculated in step S32, and the Gbase calculated in step S34, the amount of color mixture Mright from the R pixel on the right side of the G pixel (Gr) is calculated (step S36, refer to Numerical Expression 5).

Next, the data Ro of the R pixel at the right end portion of the imaging surface is extracted from the RAW data. By respectively dividing the amounts of color mixture (Mleft and Mright) calculated in steps S32 and S36 by the data pieces Ro of the R pixels, the ratios of color mixture (MRleft and MRright) from the left and right sides of the G pixel (Gr) at the right end portion of the imaging surface are calculated (step S38).

In steps S40, S50, and S60, the following are respectively calculated: the ratios of color mixture (MRleft and MRright) from the left and right sides of the G pixel (Gr) at the left end portion of the imaging surface; the ratios of color mixture (MRtop and MRbottom) from the upper and lower sides of the G pixel (Gb) at the top end portion of the imaging surface; and the ratios of color mixture (MRtop and MRbottom) from the upper and lower sides of the G pixel (Gb) at the bottom end portion of the imaging surface. In addition, the calculations of the ratios of color mixture in the steps S40, S50, and S60 can be performed in a manner similar to that in step S30, and thus detailed description will be omitted.

As described above, when the ratios of color mixture (MRleft, MRright, MRtop, and MRbottom) at the central portion of the imaging surface of the color imaging element and the ratios of color mixture (MRleft, MRright, MRtop, and MRbottom) at the end portions of the imaging surface are calculated, the interpolation processing section 13 of the color-mixture-ratio calculation section 12 performs linear interpolation on the ratios of color mixture, thereby calculating the ratios of color mixture between the central portion and the end portions of the imaging surface. Then, the color-mixture-ratio calculation section 12 associates the separate ratios of color mixture according to the directions of the color mixture with the distances and directions (positions on the imaging surface) from the central portion of the imaging surface, and stores those in the storage section 14 (step S70).

The processes from the step S10 to step S70 are performed for each of image capturing operations when the photography condition setting section 15 changes the photography condition (F number or zoom ratio) of the imaging device 50 and image capturing is performed under the changed photography condition.

First Modification Example of First Embodiment

In the color imaging element shown in FIGS. 5A-5C, the R pixel is adjacent to the OB section 5 at the right end portion of the imaging surface (FIG. 5C), and the R pixel is not adjacent to the OB section 5 at the left end portion of the imaging surface (FIG. 5A).

The first modification example of the first embodiment is an embodiment of a color-mixture-ratio calculation method in the case where the R pixel is not adjacent to the OB section 5.

Figure 6:
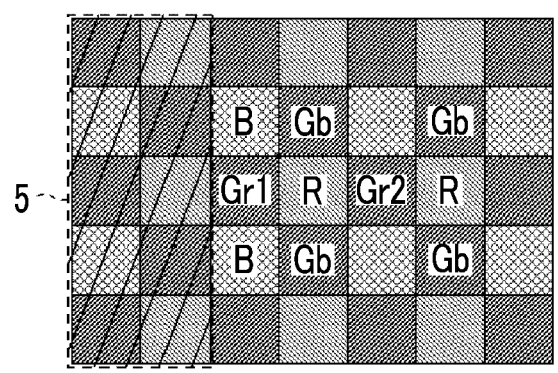
FIG. 6 is a plan view of a main section on the left end side of the imaging surface when R pixels are not adjacent to an OB section on the left end side of the imaging surface.

FIGS. 5A and 6 show examples of the case where the R pixel is not adjacent to the OB section 5 on the left end side of the imaging surface (G pixels (Gr1) are adjacent thereto).

In this case, the amount of color mixture from the R pixel cannot be calculated directly from the outputs of the pixels of the OB section 5.

However, the G pixel (Gr1) is adjacent to the OB section 5. Hence, there is no color mixture from the left side (OB section 5). Accordingly, the amount of color mixture Mright from the right side of the G pixel (Gr1) can be calculated through the following expression from an output Gr1$o$ of the G pixel (Gr1) and the Gbase of the G pixel (Gr1) (Numerical Expression 4).

$Gr1o = Gbase + Mright$ $Mright = Gr1o - Gbase$      [Numerical Expression 6]

Meanwhile, at the left end portion of the imaging surface, assuming that the amount of color mixture from the left side to the G pixel (Gr2) to which the R pixels are adjacent in the left and right directions is Mleft and an output of the G pixel (Gr2) is Gr2$o$, the output Gr2$o$ can be represented by the following expression.

$Gr2o = Gbase + Mright + Mleft$ $Mleft = Gr2o - (Gbase + Mright)$      [Numerical Expression 7]

Accordingly, the amount of color mixture (Mleft) from the left side can be calculated by subtracting the output Gr1$o$ of the G pixel (Gr1) (refer to Numerical Expression 6) from the output Gr2$o$ of the G pixel (Gr2).

At the left end portion of the imaging surface, assuming that the ratios of color mixture from the left and right sides of the G pixel are MRleft and MRright, the ratios of color mixture MRleft and MRright can be calculated, on the basis of the output Ro of the pixel R at the left end portion of the imaging surface and the calculated amounts of color mixture (Mleft and Mright) from the left and the right, by using the above-mentioned Numerical Expression 3.

At the other end portion of the imaging surface, when the R pixel is not adjacent to the OB section 5 on the end portion side of the imaging surface, the separate ratios of color mixture according to the directions of the color mixture at the end portion of the imaging surface can be calculated in a manner similar to that of the modification example of the first embodiment. Further, the ratio of color mixture independent of the directions of the color mixture at the central portion of the imaging surface can be calculated in a manner similar to that of the first embodiment.

Figure 7:
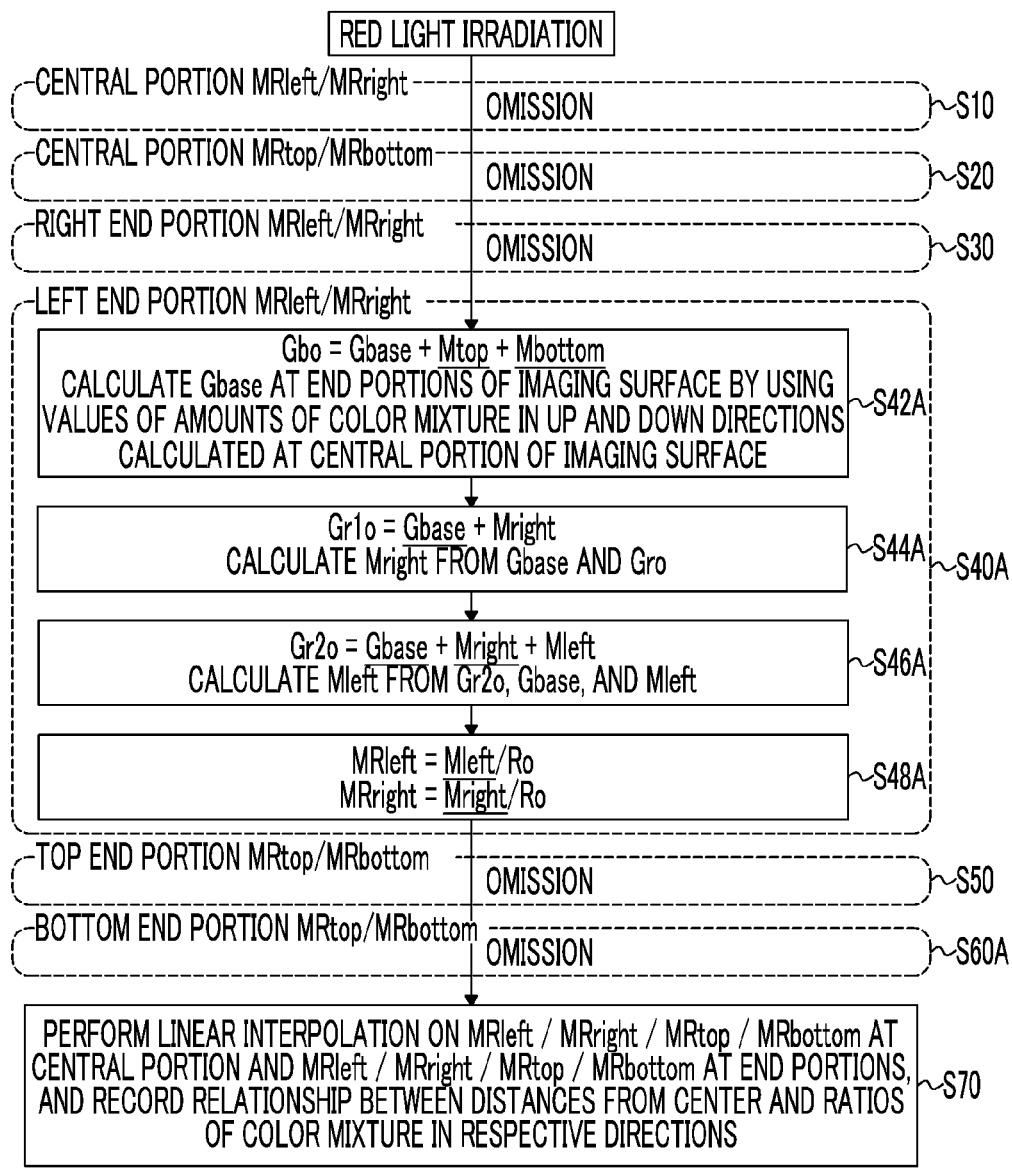
FIG. 7 is a flowchart illustrating a procedure of calculation of ratios of color mixture according to a color-mixture-ratio calculation method of a first modification example of the first embodiment.

FIG. 7 is a flowchart illustrating a procedure of calculation of ratios of color mixture according to a color-mixture-ratio calculation method of the first modification example of the first embodiment. In addition, steps common to those of the first embodiment shown in FIG. 4 will be referenced by the same step numerals, and detailed description will be omitted.

As shown in FIG. 7, in the first modification example of the first embodiment, the processes of steps S40A and S60A are different from the processes of steps S40 and S60 of the first embodiment.

In step S40A, the separate ratios of color mixture according to the directions of the color mixture (according to the left and right directions) from the R pixel at the left end portion of the imaging surface of the color imaging element to the G pixels (Gr1 and Gr2) are calculated. As shown in FIGS. 5A and 6, the G pixel (Gr1) is adjacent to the OB section 5 on the left end side of the imaging surface. Therefore, first, in order to calculate a Bbase of the G pixel (Gr1), a Bbase of the G pixel (Gb) at the left end portion of the imaging surface is calculated, and this is set as the Bbase of the G pixel (Gr1) (step S42A). In addition, the Bbase of the G pixel (Gb) at the left end portion of the imaging surface can be calculated in a manner similar to that of step S34 of FIG. 4.

Subsequently, the data Gr1$o$ of the G pixel (Gr1) at the left end portion of the imaging surface is extracted from the RAW data. On the basis of the data Gr1$o$ and the Bbase calculated in step S42, the amount of color mixture (Mright) from the R pixel to the G pixel (Gr1) is calculated (step S44A, Numerical Expression 6).

When the amount of color mixture (Mright) from the right side is calculated, data Gr2$o$ of the G pixel (Gr2) at the left end portion of the imaging surface is extracted from the RAW data. On the basis of the data Gr2$o$, the Bbase calculated in step S42, and the amount of color mixture (Mright) calculated in step S44, the amount of color mixture (Mleft) from the left side is calculated (step S36, refer to Numerical Expression 7). In addition, the amount of color mixture (Mleft) from the left side can be calculated by subtracting the data Gr1$o$ of the G pixel (Gr1) from the data Gr2$o$ of the G pixel (Gr2).

Next, the data Ro of the R pixel at the left end portion of the imaging surface is extracted from the RAW data. By respectively dividing the amounts of color mixture (Mleft and Mright) calculated in steps S44 and S46 by the data pieces Ro of the R pixels, the separate ratios of color mixture according to the directions of the color mixture (MRleft and MRright) at the left end portion of the imaging surface are calculated (step S48A).

In step S60A, the separate ratios of color mixture according to the directions of the color mixture (according to the up and down directions) from the R pixel at the bottom end portion of the imaging surface of the color imaging element to the G pixel (Gb) are calculated. Here, the G pixel (Gb) is adjacent to the OB section at the bottom end portion of the imaging surface, in a manner similar to the left end portion of the imaging surface. Accordingly, the calculation of the ratios of color mixture in step S60A may be performed in a manner similar to that in step S40A.

Second Modification Example of First Embodiment

A second modification example of the first embodiment is another embodiment of the color-mixture-ratio calculation method in the following case. The R pixel is adjacent to the OB section at one end portion of both of the left and right end portions of the imaging surface or both of the upper and lower end portions of the imaging surface, and the R pixel is not adjacent to the OB section at the other end portion.

In the second modification example of the first embodiment, at the end portion of the imaging surface where the R pixel is adjacent to the OB section, in a manner similar to that of the first embodiment, the separate ratios of color mixture according to the directions of the color mixture at the end portion of the imaging surface are calculated. In addition, at the end portions of the imaging surface where the R pixel is not adjacent to the OB section, the calculated separate ratios of color mixture according to the directions of the color mixture are inversed, and the inversed ratios are used.

For example, at the right end portion of the imaging surface where the R pixel is adjacent to the OB section, the ratio of color mixture MRleft from the left side and the ratio of color mixture MRright from the right side may be calculated. In this case, for the ratio of color mixture from the left side at the left end portion of the imaging surface where the R pixel is not adjacent to the OB section, the calculated ratio of color mixture MRright from the right side is used. In addition, for the ratio of color mixture from the right side at the left end portion of the imaging surface, the calculated ratio of color mixture MRleft from the left side is used.

Second Embodiment

A second embodiment of the present invention is another embodiment of the color-mixture-ratio calculation method applied to the color imaging element having the Bayer array. The second embodiment is different from that of the first embodiment in terms of a configuration of the OB section of the color imaging element having the Bayer array. In addition, the second embodiment is different from that of the first embodiment in terms of the color-mixture-ratio calculation directions at the end portions of the imaging surface where the OB section is used.

Figures 8A, 8B, 8C:
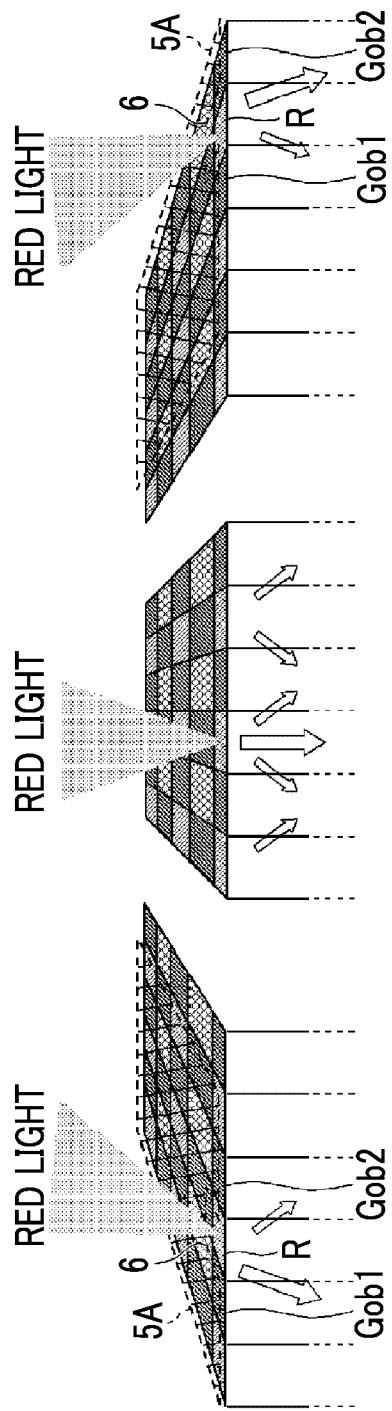
FIGS. 8A, 8B, and 8C are respectively conceptual diagrams illustrating color mixture from R pixels to G pixels, which are adjacent in the left and right directions, at the left end portion, the central portion, and the right end portion of the color imaging element according to a second embodiment.
Figure 9:
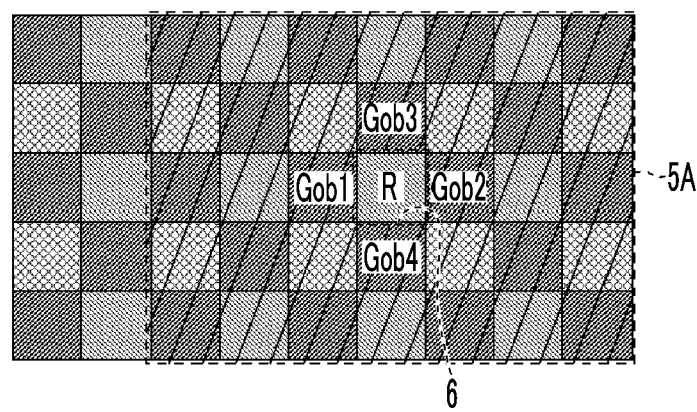
FIG. 9 is a plan view of a main section at the right end portion of the color imaging element according to the second embodiment.

FIGS. 8A, 8B, and 8C are respectively conceptual diagrams illustrating color mixture from R pixels to G pixels, which are adjacent in the left and right directions, at the left end portion, the central portion, and the right end portion of the color imaging element according to the second embodiment. FIG. 9 is a plan view of a main section at the right end portion of the color imaging element according to the second embodiment.

The color imaging element corresponding to the second embodiment is different from the color imaging element of the first embodiment in that R pixels for color-mixture-ratio calculation each having an opening 6 are provided in an OB section 5A.

The R pixel for color-mixture-ratio calculation is an R pixel separated by a distance of two or more pixels from an effective pixel region. It is preferable that the R pixel is the pixel closest to the effective pixel region.

As shown in FIG. 9, assuming that four G pixels adjacent to the R pixel for color-mixture-ratio calculation having the opening 6 are respectively Gob1, Gob2, Gob3, and Gob4, each of outputs Gob1o to Gob4o of the G pixels Gob1 to Gob4 indicates the amount of color mixture from the R pixel for color-mixture-ratio calculation.

That is, the output Gob1o of the G pixel Gob1 indicates the amount of color mixture Mright from the R pixel (right direction) adjacent to the right side thereof (Gob1o=Mright). In addition, the output Gob2o of the G pixel Gob2 indicates the amount of color mixture Mleft from the R pixel (left direction) adjacent to the left side thereof (Gob2o=Mleft).

Accordingly, assuming that the output of the R pixel for color-mixture-ratio calculation is Ro, the ratios of color mixture MRleft and MRright from the left and right sides at the right end portion of the imaging surface can be calculated by dividing the amounts of color mixture Mleft and Mright from the left and right sides, which are detected by the G pixels Gob1 and Gob2, by the output Ro of the pixel R (refer to Numerical Expression 3).

In a manner as described above, by dividing the outputs of the G pixels, which are adjacent to the R pixel for color-mixture-ratio calculation, by the output of the R pixel for color-mixture-ratio calculation having the opening 6 provided in the OB section 5A at the end portion, the following can be calculated: the ratios of color mixture (MRleft and MRright) from the left and the right of the G pixel at the left end portion of the imaging surface; the ratios of color mixture (MRtop and MRbottom) from the upper and lower sides of the G pixel at the top end portion of the imaging surface; and the ratios of color mixture (MRtop and MRbottom) from the upper and lower sides of the G pixel at the bottom end portion of the imaging surface.

Figure 10:
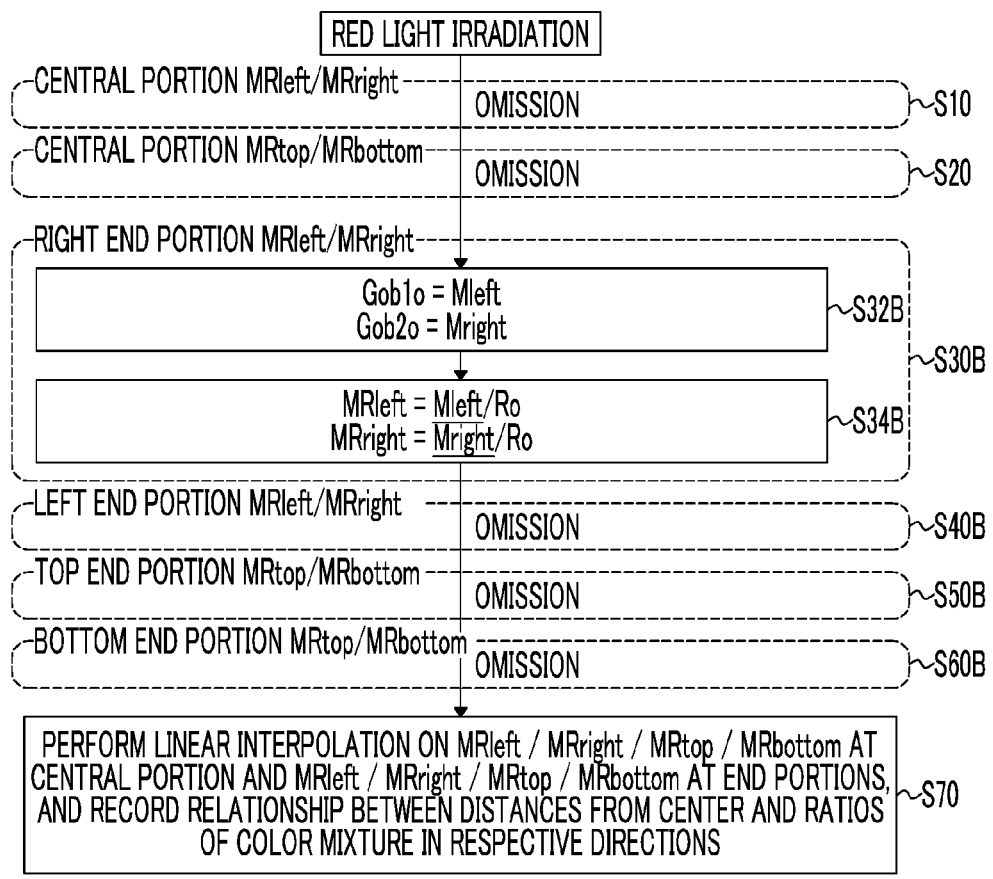
FIG. 10 is a flowchart illustrating a procedure of calculation of ratios of color mixture according to a color-mixture-ratio calculation method of the second embodiment.

FIG. 10 is a flowchart illustrating a procedure of calculation of ratios of color mixture according to the color-mixture-ratio calculation method of the second embodiment. In addition, steps common to those of the first embodiment shown in FIG. 4 will be referenced by the same step numerals, and detailed description will be omitted.

As shown in FIG. 10, in the second embodiment, processes of steps S30B to S60B are different from the processes of steps S30 to S60 of the first embodiment.

In step S30B, the separate ratios of color mixture according to the directions of the color mixture (according to the left and right directions) from the R pixels at the right end portion of the imaging surface of the color imaging element to the G pixels (Gr), which are adjacent in the left and right directions, are calculated. As shown in FIGS. 8C and 9, the G pixels Gob1 and Gob2, which are shielded from light by the OB section 5A, are adjacent to the left and right sides of the R pixel for color-mixture-ratio calculation having the opening 6 provided in the OB section 5A. The outputs Gob1o and Gob2o1 of the G pixels Gob1 and Gob2 are respectively extracted (detected), as the amounts of color mixture (Mleft and Mright) from the R pixel for color-mixture-ratio calculation, from the RAW data (step S32B).

Next, the data Ro of the R pixel for color-mixture-ratio calculation is extracted from the RAW data. By respectively dividing the amounts of color mixture (Mleft and Mright) detected in step S32B by the data pieces Ro of the R pixels, the separate ratios of color mixture according to the directions of the color mixture (MRleft and MRright) at the right end portion of the imaging surface are calculated (step S34B).

In steps S40B, S50B, and S60B, in a manner similar to that in the step S30B, by dividing the outputs of the G pixels, which are adjacent to the R pixel for color-mixture-ratio calculation, by the output of the R pixel for color-mixture-ratio calculation having the opening 6 provided in the OB section 5A at the end portion, the following are calculated: the ratios of color mixture (MRleft and MRright) from the left and the right of the G pixel at the left end portion of the imaging surface; the ratios of color mixture (MRtop and MRbottom) from the upper and lower sides of the G pixel at the top end portion of the imaging surface; and the ratios of color mixture (MRtop and MRbottom) from the upper and lower sides of the G pixel at the bottom end portion of the imaging surface.

Modification Example of Second Embodiment

In the second embodiment, the ratio of color mixture at the central portion of the imaging surface is calculated in a manner similar to that in the first embodiment. However, a modification example of the second embodiment is different from the second embodiment in that the ratio of color mixture at the central portion of the imaging surface is calculated on the basis of the output of the R pixel for color-mixture-ratio calculation and the outputs of the G pixels adjacent to the R pixel for color-mixture-ratio calculation.

An incidence angle of incidence of the red light into the R pixel for color-mixture-ratio calculation having the opening 6 shown in FIG. 6 has an angle which is constant in the left and right directions, but the incidence angle in the up and down directions can be regarded as zero. Accordingly, on the basis of the outputs Gob3$o$ and Gob4$o$ of the upper and lower G pixels Gob3 and Gob4 among four G pixels adjacent to the R pixel for color-mixture-ratio calculation and the output Ro of the pixel R for color-mixture-ratio calculation, the ratios of color mixture (MRtop and MRbottom) in the up and down directions at the central portion of the imaging surface can be calculated.

Likewise, on the basis of the output of the R pixel for color-mixture-ratio calculation provided in the OB section on the upper or lower side of the effective pixel region of the color imaging element and the outputs of the G pixels adjacent to the R pixel in the left and right directions, the ratios of color mixture (MRleft and MRright) in the left and right directions at the central portion of the imaging surface can be calculated. In addition, at the central portion of the imaging surface, the ratio of color mixture independent of the directions of the color mixture is obtained. Hence, a ratio of color mixture, which is obtained by averaging the separate ratios of color mixture (MRtop, MRbottom, MRleft, and MRright) according to the up, down, left, and right directions, may be set as the ratio of color mixture at the central portion of the imaging surface.

Third Embodiment

A third embodiment of the present invention is an embodiment of the color-mixture-ratio calculation method applied to a color imaging element having a new color filter array (new CF array).

As shown in FIG. 28A, the color imaging element having the new CF array is configured such that units (basic array patterns) of 6×6 pixels are repeatedly arranged in the horizontal and vertical directions (the left and right directions and the up and down directions). As compared with the color imaging element having the Bayer array in units of 2×2 pixels, an array of RGB pixels is aperiodic, moiré is reduced, and it is possible to prevent false colors from occurring.

In the color imaging element having the new CF array, there are G and B pixels, where only one pixel among the four pixels adjacent in the up, down, left, and right directions is the R pixel.

Figure 11:
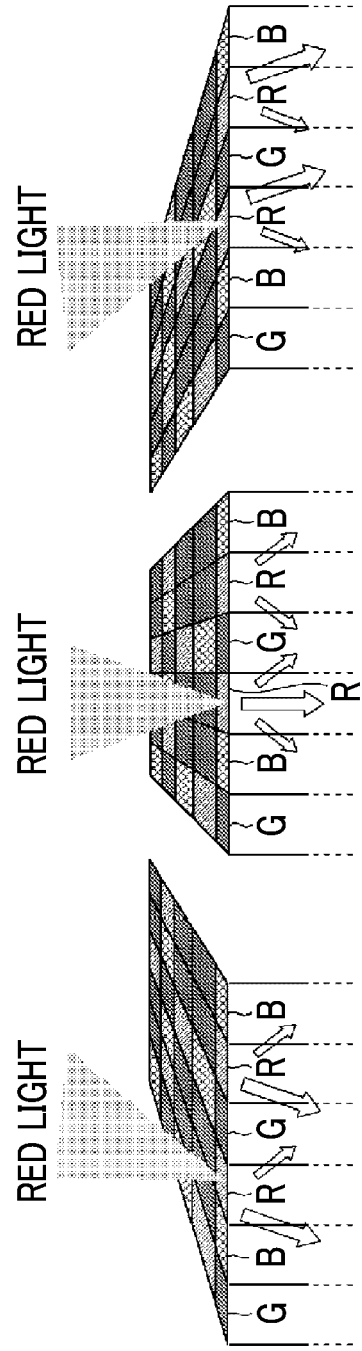
FIGS. 11A, 11B, and 11C are respectively conceptual diagrams illustrating color mixture from R pixels to B and G pixels, which are adjacent in the left and right directions, at the left end portion, the central portion, and the right end portion of the color imaging element having a new CF array.
Figure 12:
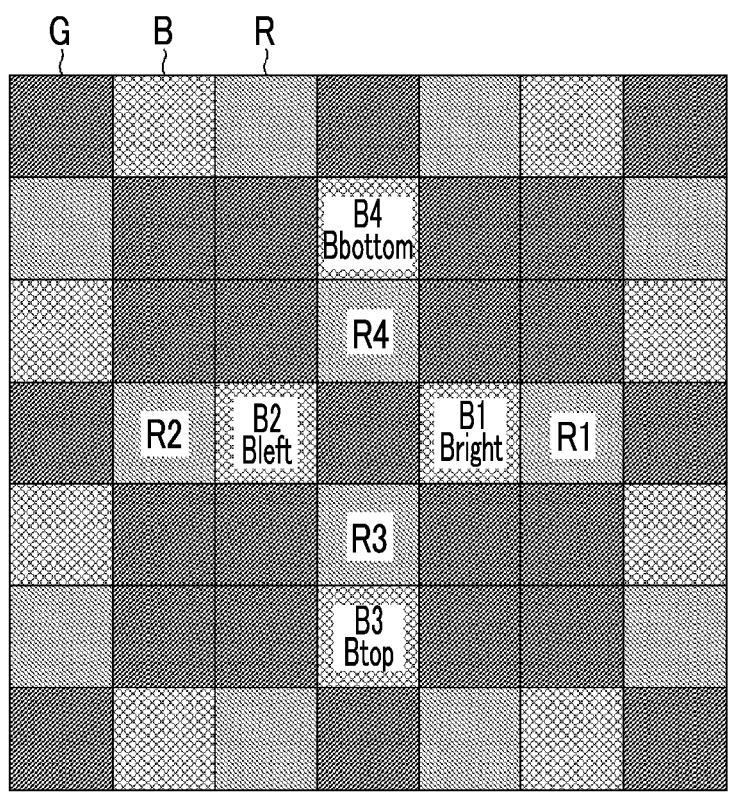
FIG. 12 is a plan view of a main section of the color imaging element having the new CF array.

FIGS. 11A, 11B, and 11C are respectively conceptual diagrams illustrating color mixture from R pixels to B and G pixels, which are adjacent in the left and right directions, at the left end portion, the central portion, and the right end portion of the color imaging element having the new CF array. FIG. 12 is a plan view of a main section of the color imaging element having the new CF array.

Only one pixel among four pixels, which are adjacent to each of B pixels B1 to B4 shown in FIG. 12 in the up, down, left, and right directions, is one of R pixels R1 to R4, and the directions of the adjacent R pixels R1 to R4 are mutually different.

If red light with a short wavelength is incident onto the imaging surface of the color imaging element having the new CF array, assuming that the amounts of color mixture from the R pixels R1 to R4 are respectively Mright, Mleft, Mtop and Mbottom, outputs Bright, Bleft, Btop, and Bbottom of the B pixels B1 to B4 can be represented by the following expression.

$B\text{right}=B\text{base}+M\text{right}$ $B\text{left}=B\text{base}+M\text{left}$ $B\text{top}=B\text{base}+M\text{top}$ $B\text{bottom}=B\text{base}+M\text{bottom}$ [Numerical Expression 8]

Here, the Bbase is a value corresponding to red light transmitted through a B filter as a result of partial overlap between a transmission wavelength region of the B filter of the B pixel and a wavelength region of the red light. The Bbase can be logically calculated from an intensity of the red light, a transmittance of the red light through the B filter, and photoelectric conversion efficiency. However, the transmittance of the red light through the B filter extremely decreases in accordance with the wavelength of the red light and characteristics of the B filter, and thus can be set as zero.

Accordingly, the amounts of color mixture (Mright, Mleft, Mtop, and Mbottom) from the adjacent R pixels R1 to R4 can be calculated from the outputs Bright, Bleft, Btop, and Bbottom of the B pixels B1 to B4 when the red light with the short wavelength is incident onto the imaging surface of the color imaging element.

Assuming that the ratios of color mixture of the B pixels B1 to B4 are respectively MRright, MRleft, MRtop, and MRbottom, on the basis of the outputs R1 to R4 of the R pixels R1 to R4 and the amounts of color mixture (Mright, Mleft, Mtop, and Mbottom) calculated as described above, the ratios of color mixture (MRright, MRleft, MRtop, and MRbottom) can be calculated by the following expression.

$MR\text{right}=M\text{right}/R1o$ $MR\text{left}=M\text{left}/R2o$ $MR\text{top}=M\text{top}/R3o$ $MR\text{bottom}=M\text{bottom}/R4o$ [Numerical Expression 9]

The new CF array is configured such that the basic array patterns of 6×6 pixels are repeatedly arranged in the horizontal and vertical directions (left and right directions and up and down directions). Hence, the separate ratios of color mixture (MRright, MRleft, MRtop, and MRbottom) according to the directions of the color mixture can be calculated in the entire area of the color imaging element.

Thereby, it is not necessary to particularly measure and calculate the ratio of color mixture at the central portion of the imaging surface and the separate ratios of color mixture according to the directions of the color mixture at the end portions of the imaging surface as described in the first and second embodiments and thereby calculate the ratios of color mixture between the central portion of the imaging surface and the end portions of the imaging surface through interpolation. Further, even if the ratio of color mixture from the opposite side becomes zero in the course from the central portion of the imaging surface to the end portion, it is possible to accurately calculate the ratio of color mixture.

Figure 13:
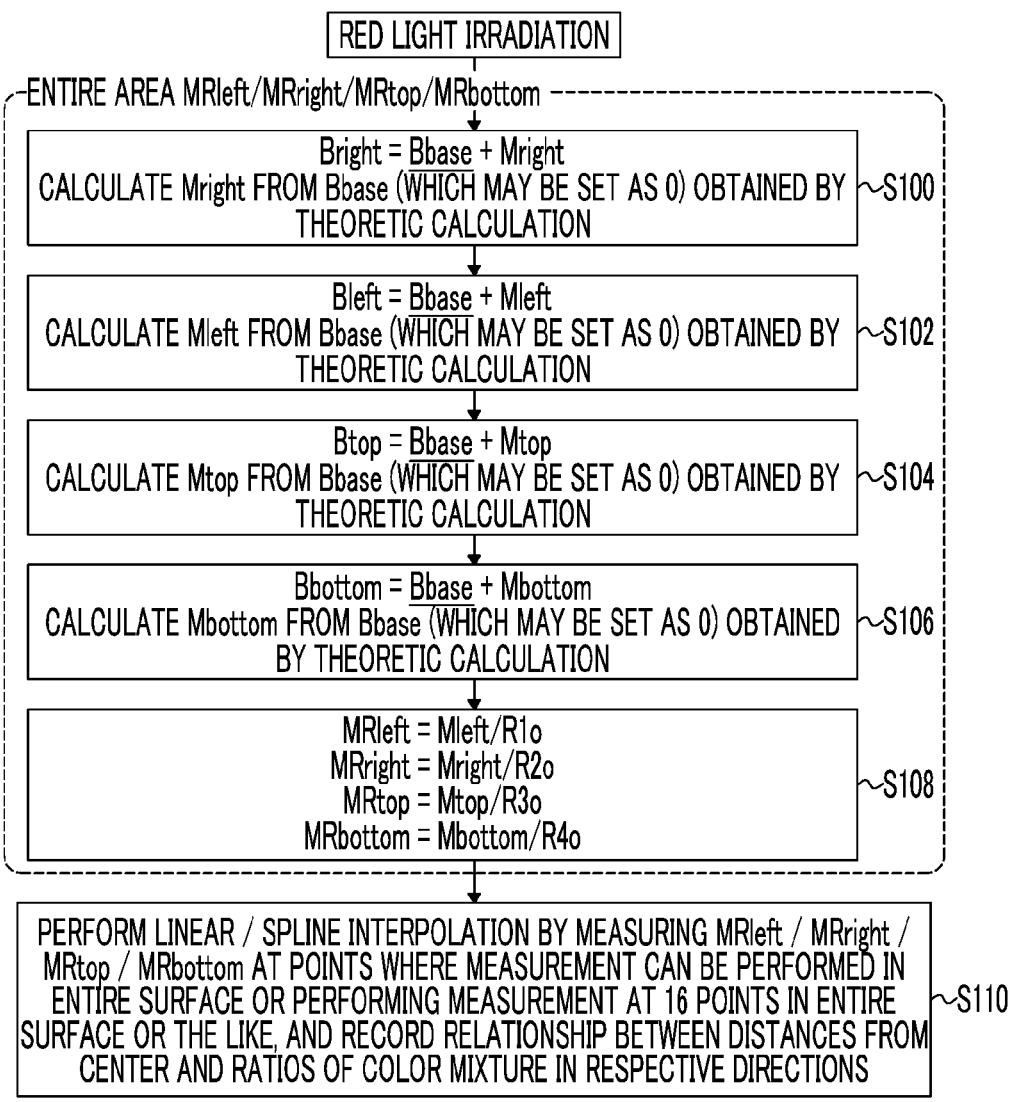
FIG. 13 is a flowchart illustrating a procedure of calculation of ratios of color mixture according to a color-mixture-ratio calculation method of a third embodiment.

FIG. 13 is a flowchart illustrating a procedure of calculation of ratios of color mixture according to the color-mixture-ratio calculation method of the third embodiment, and mainly indicates processing contents of the color-mixture-ratio calculation section 12 shown in FIG. 1.

The imaging device 50 as a target of the color-mixture-ratio calculation has the color imaging element having the new CF array, and receives only red light emitted from the red light emitting section 60, and outputs RAW data corresponding to an amount of the received light.

The color-mixture-ratio calculation section 12 inputs the RAW data through the RAW data acquisition section 11, and performs the following processing shown in FIG. 13, on the basis of the input RAW data.

As shown in FIG. 12, the output Bright of the B pixel B1, to which the R pixel R1 is adjacent on the right side, is extracted from the RAW data. On the basis of the output Bright and the Bbase, the amount of color mixture Mright (amount of color mixture from the right side) from the R pixel R1 to the B pixel B2 is calculated through the above-mentioned Numerical Expression 8 (step S100). In addition, as the Bbase, a given value, which is obtained through logic calculation, may be used, and zero may be used.

Likewise, the output Bleft of the B pixel B2, to which the R pixel R2 is adjacent on the left side, is extracted from the RAW data. On the basis of the output Bleft and the Bbase, the amount of color mixture Mleft (amount of color mixture from the left side) is calculated (step S102). The output Btop of the B pixel B3, to which the R pixel R3 is adjacent on the upper side, is extracted from the RAW data. On the basis of the output Btop and the Bbase, the amount of color mixture Mtop (amount of color mixture from the upper side) is calculated (step S104). The output Bbottom of the B pixel B4, to which the R pixel R4 is adjacent on the lower side, is extracted from the RAW data. On the basis of the output Bbottom and the Bbase, the amount of color mixture Mbottom (amount of color mixture from the upper side) is calculated (step S106).

The calculated separate amounts of color mixture (Mright, Mleft, Mtop, and Mbottom) according to the directions of the color mixture are respectively divided by the outputs R1*o*R4*o* of the adjacent R pixels R1 to R4. Thereby, the separate ratios of color mixture (MRright, MRleft, MRtop, and MRbottom) according to the directions of the color mixture are calculated (step S108, Numerical Expression 8).

The processes of the step S100 to step S108 are performed on all the points (all the B pixels), which can be measured, in the imaging surface of the color imaging element.

The color-mixture-ratio calculation section 12 associates the separate ratios of color mixture (MRright, MRleft, MRtop, and MRbottom) according to the directions of the color mixture, which are measured in terms of all the B pixels within the imaging surface of the color imaging element, with the positions of the B pixels or the directions and the distances from the central portion of the imaging surface, and stores those in the storage section 14 (step S110).

The measurement of the ratios of color mixture is not limited to all the B pixels within the imaging surface of the color imaging element. For example, by measuring the separate ratios of color mixture according to the directions of the color mixture for each segmented region, which is obtained by segmenting the imaging surface into 16 parts, and performing linear interpolation or spline interpolation on the measurement result, the separate ratios of color mixture according to the directions of the color mixture in the entire area within the imaging surface may be calculated. As a result, the calculated ratios of color mixture may be associated with the directions and the distances from the central portion of the imaging surface, and those may be stored in the storage section 14.

In the third embodiment, the ratios of color mixture are calculated on the basis of the outputs between the B pixels and an R pixel. However, only one pixel among four pixels, which are adjacent to the upper, lower, left, and right sides of each of the 2×2 G pixels within the color imaging element having the new CF array, is the R pixel. Hence, on the basis of the outputs of the G pixels and the outputs of the R pixels adjacent to the G pixels, the ratios of color mixture may be calculated.

Modification Example of Third Embodiment

Figure 14A:
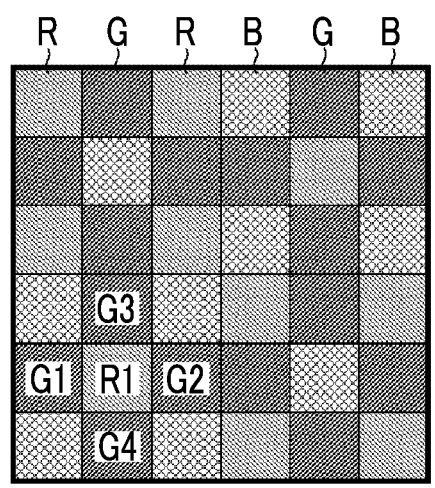
FIGS. 14A and 14B are respectively plan views of main sections of different color imaging elements capable of using the color-mixture-ratio calculation method according to the third embodiment.
Figure 14B:
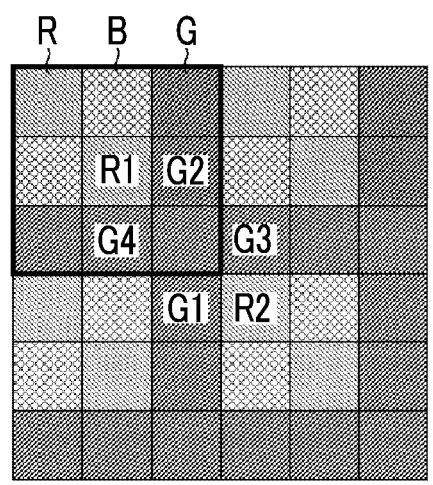

FIGS. 14A and 14B are respectively plan views of main sections of different color imaging elements capable of using the color-mixture-ratio calculation method according to the third embodiment.

Figures 29A, 29B, 29C:
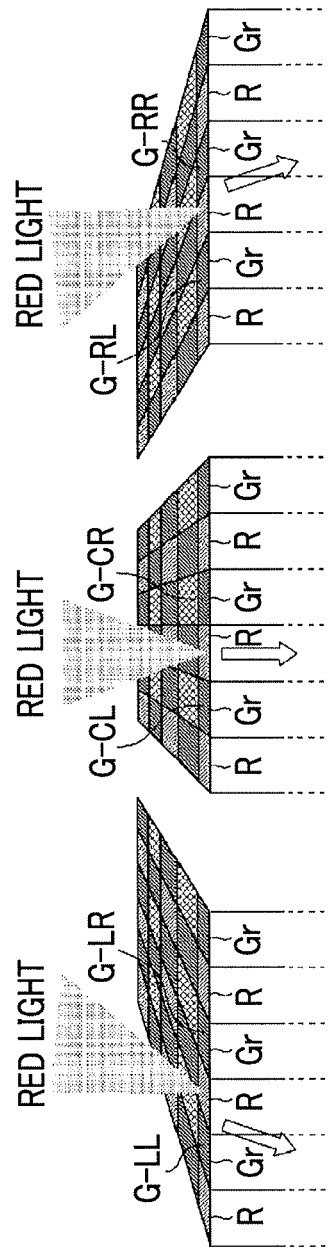
FIGS. 29A to 29C are a diagram illustrating a conventional method of calculating amounts of color mixture from a red pixel to green pixels at the left end portion, the central portion, and the right end portion of the color imaging element having the Bayer array.

The color imaging element shown in FIG. 14A is configured such that units (basic array patterns) of 6×6 pixels are repeatedly arranged in the left and right directions and the up and down directions. Thus, the color imaging element is the same as the color imaging element having a new color filter array shown in FIG. 29A or the like except for arrangement of RGB color pixels within the basic array pattern.

Four G pixels G1 to G4 are adjacent to the R pixel R1 shown in FIG. 14A, but only one pixel among four pixels, which are adjacent to the upper, lower, left, and right sides of each of the G pixels G1 to G4, is the R pixel R1. Hence, in a manner similar to that in the third embodiment, the separate ratios of color mixture according to the up, down, left, and right directions of the color mixture can be calculated on the basis of the outputs of the G pixels G1 to G4 and the output of the R pixel R1 when red light with a short wavelength is incident onto the imaging surface of the color imaging element.

The color imaging element shown in FIG. 14B is configured such that units (basic array patterns) of 3×3 pixels are repeatedly arranged in the left and right directions and the up and down directions.

The G pixels G2 and G4 are adjacent to the R pixel R1 shown in FIG. 14B, and the G pixels G1 and G3 are adjacent to the R pixel R2. However, only one pixel among four pixels, which are adjacent to the upper, lower, left, and right sides of each of the G pixels G1 to G4, is the R pixel R1 or the R pixel R2. Hence, in a manner similar to that in the third embodiment, the separate ratios of color mixture according to the up, down, left, and right directions of the color mixture can be calculated on the basis of the outputs of the G pixels G1 to G4 and the outputs of the R pixels R1 and R2 when red light with a short wavelength is incident onto the imaging surface of the color imaging element.

The color imaging element, for which the color-mixture-ratio calculation method according to the third embodiment can be used, is not limited to the imaging element having the new CF array shown in FIG. 28A and the color imaging element shown in FIGS. 14A and 14B, and various things are considered as the color imaging element. In short, a color imaging element may be used if the element has pixels each of which is adjacent to four pixels having only one R pixel and has a color different from that of the R pixel.

[Imaging Device]

Figure 15:
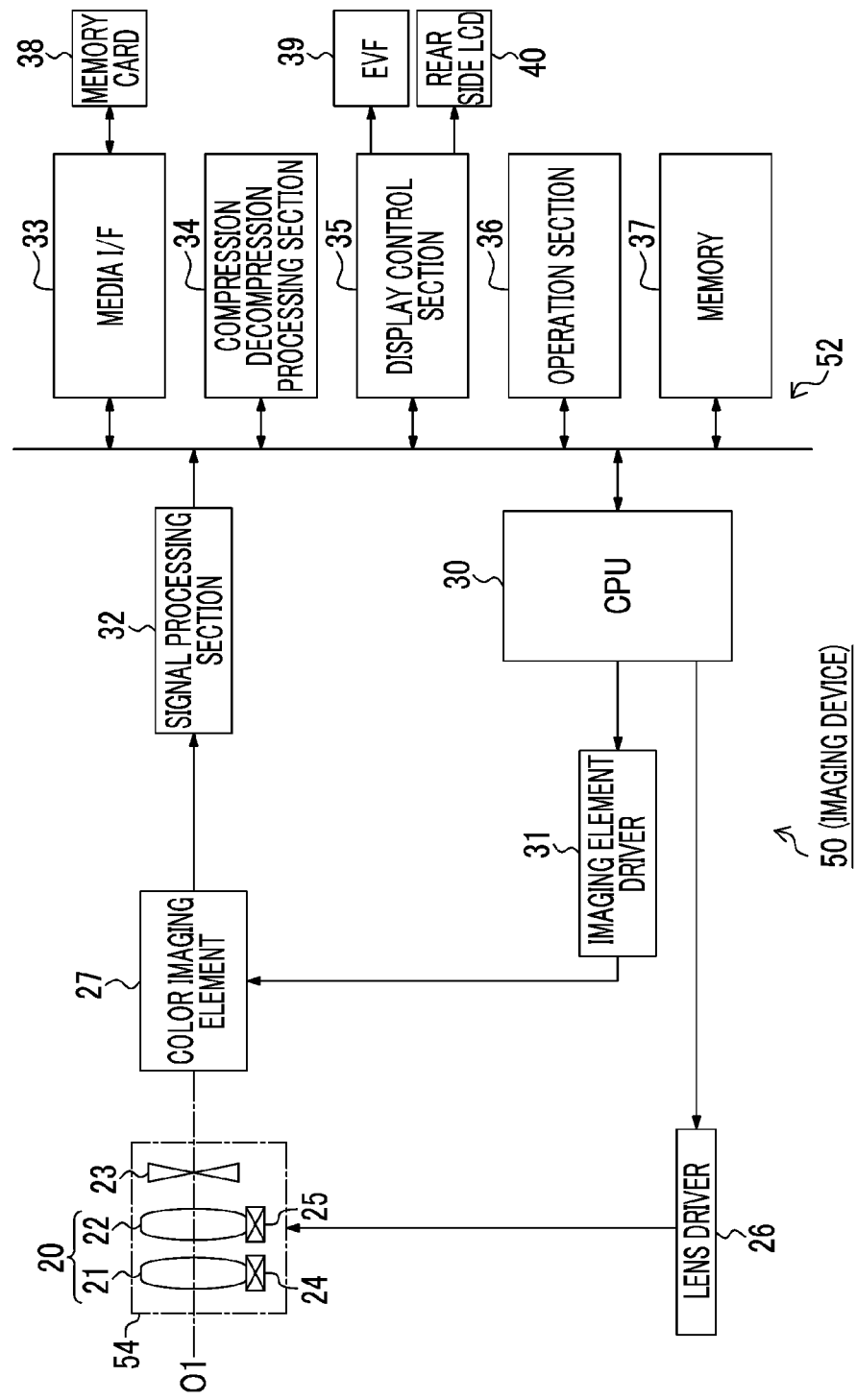
FIG. 15 is a block diagram illustrating an embodiment of an internal configuration of an imaging device according to the present invention.

FIG. 15 is a block diagram illustrating an embodiment of the imaging device according to the present invention, and shows an internal configuration of the imaging device 50 shown in FIG. 1.

In FIG. 15, the imaging device 50 includes a camera main body 52, and a lens unit (interchangeable lens) 54 which is mounted onto the front side of the camera main body 52 so as to be replaceable.

The lens unit 54 includes: a photography lens (photography optical system) 20 that includes a zoom lens 21 and a focus lens 22; and an aperture stop 23. The zoom lens 21 and the focus lens 22 are respectively driven by a zoom mechanism 24 and a focus mechanism 25 so as to be movable along an optical axis O1 of the photography lens 20. The zoom mechanism 24 and the focus mechanism 25 are formed of gears, motors, and the like.

The aperture stop 23 is driven by an aperture stop driving section (not shown in the drawing). For example, the aperture stop driving section performs aperture stop control in 22 stages based on 1/3 AV cuts in an F number range of F1.4 to F16. The aperture stop 23, the zoom mechanism 24 and the focus mechanism 25 are driven and controlled by a CPU 30 with the aid of a lens driver 26.

The CPU 30, which is provided in the camera main body 52, integrally controls the respective sections of the imaging device 50 by sequentially executing various programs and various kinds of data which are read from a memory (storage section) 37, on the basis of a control signal sent from an operation section 36. A RAM area of the memory 37 functions as a work memory for causing the CPU 30 to execute processing or a temporary storage of various kinds of data. Further, a ROM area of the memory 37 stores various programs, data which indicates the ratios of color mixture for color mixture correction according to the present invention, and the like.

The operation section 36 includes buttons, keys, a touch panel, and the like which are operated by a user. For example, the operation section 36 may include a power supply switch, a shutter button, a focus mode switch lever, a focus ring, a mode switch button, a cross selection key, an execution key, a back button, and the like which are provided in the camera main body 52 and are operated by a user.

The color imaging element 27 constitutes an image capturing section together with the photography lens 20, and converts the light of the subject, which passes through the photography lens 20 and the aperture stop 23, into an electrical output signal, and outputs the signal. In the color imaging element 27, the color filters may have either the Bayer array or the new CF array. However, a description will be hereinafter given under an assumption that the color imaging element 27 is a color imaging element having the Bayer array. Further, the color imaging element 27 may employ an arbitrary type such as a complementary metal oxide semiconductor (CMOS) or a charge coupled device (CCD).

An imaging element driver 31 drives and controls the color imaging element 27 under control of the CPU 30, and outputs a captured image signal (RAW data) to a signal processing section 32 from the pixels of the color imaging element 27.

The signal processing section 32 generates photographed image data by performing signal processing on the RAW data which is output from the color imaging element 27. The signal processing includes offset (dark current) correction, color mixture correction, white balance correction, gamma correction, demosaic processing (synchronization processing), RGB/YC conversion processing, and the like. Although described later in detail, particularly, the signal processing section 32 of the present example performs color mixture correction for each of the directions of the color mixture according to the present invention.

When the shutter button is pressed down by a user, a compression decompression processing section 34 performs compression processing on the photographed image data (luminance data (Y) and color difference data) which is stored in the RAM area of the memory 37. Further, the compression decompression processing section 34 performs compression decompression processing on the compressed image data which is obtained from a memory card 38 through a media interface 33. The media interface 33 performs recording, reading, and the like of the photographed image data on the memory card 38.

In a photography mode, a display control section 35 controls at least one of an EVF (electric viewfinder) 39 and a rear side LCD (rear side liquid crystal) 40 such that it displays a through-the-lens image (live view image) which is generated by the signal processing section 32. Further, in an image reproduction mode, the display control section 35 outputs the photographed image data, which is decompressed by the compression decompression processing section 34, to the rear side LCD 40 (and/or EVF 39).

In the imaging device 50 (camera main body 52), a processing section and the like other than the above-mentioned components may be provided. For example, an AF detection section for auto focus and an AE detection section for automatic exposure adjustment may be provided. The CPU 30 executes AF processing by driving the focus lens 22 through the lens driver 26 and the focus mechanism 25 on the basis of a detection result of the AF detection section, and executes AE processing by driving the aperture stop 23 through the lens driver 26 on the basis of a detection result of the AE detection section.

Next, color mixture correction according to the present invention will be described.

Figure 16:
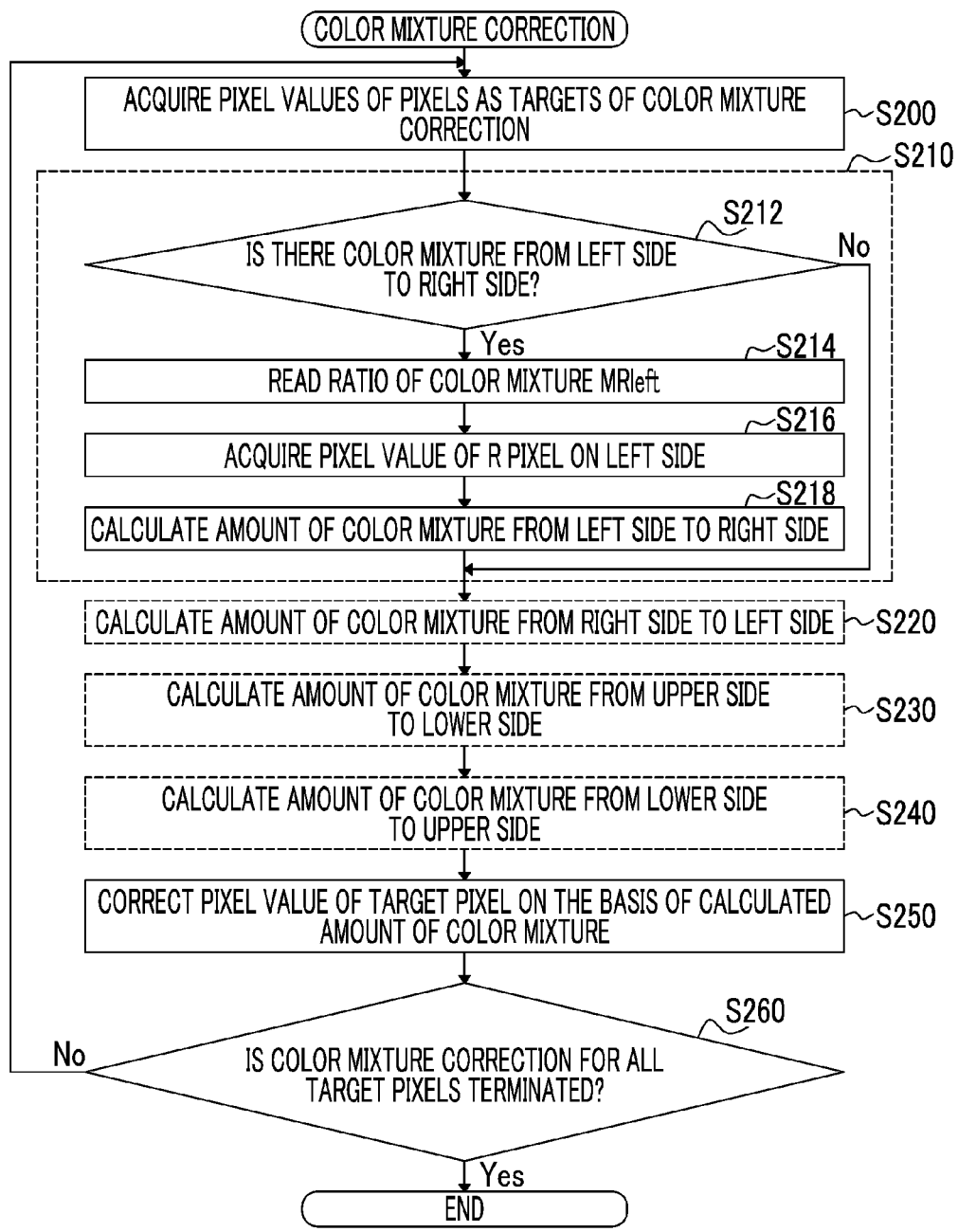
FIG. 16 is a flowchart illustrating processing contents of a color mixture correction section within a signal processing section of the imaging device.

FIG. 16 is a flowchart illustrating processing contents of a color mixture correction section within the signal processing section 32 of the imaging device 50.

In FIG. 16, the color mixture correction section in the signal processing section 32 acquires data (pixel values) of pixels as targets of the color mixture correction from the RAW data which is input from the color imaging element 27 (step S200). The color imaging element 27 of the present example is an imaging element having the Bayer array. Hence, color mixture from the R pixels occurs only in the G pixels. Accordingly, the pixels as targets of the color mixture correction are the G pixels.

Subsequently, it is determined whether or not there is color mixture from the left side to the right side of the target pixels (step S212). Here, if the G pixel is Gr, the R pixels are adjacent to the G pixel in the left and right directions. Therefore, it is determined that there is color mixture from the left side. In contrast, if the G pixel is Gb, the R pixels are not adjacent to the G pixel in the left and right directions (the R pixels are adjacent to the G pixel in the up and down directions). Therefore, it is determined that there is no color mixture from the left side.

In step S212, if it is determined that there is color mixture from the left side (if "Yes"), the ratio of color mixture MRleft from the left side corresponding to a position of the target pixel on the imaging surface is read from the memory 37 (step S214).

Figure 17:
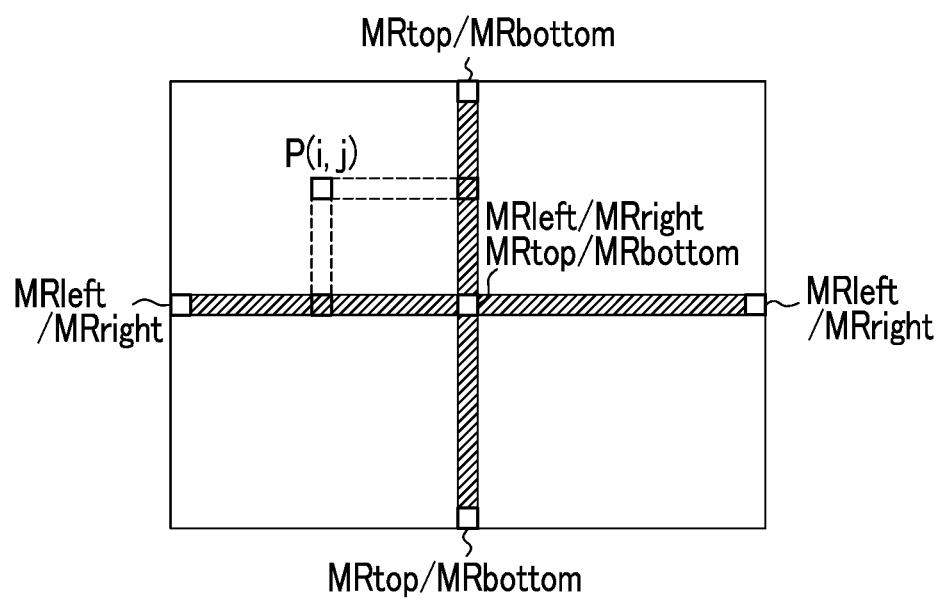
FIG. 17 is a diagram illustrating relationships between the ratio of color mixture used for a pixel at an arbitrary position of the imaging surface and the separate ratios of color mixture according to the directions of the color mixture stored in accordance with positions of the imaging surface.

As shown in FIG. 17, the memory 37 stores the ratios of color mixture (MRleft, MRright, MRtop, and MRbottom) according to the position on the imaging surface. In FIG. 17, the hatched area is a part where the separate ratios of color mixture according to the directions of the color mixture measured at the end portions and the center of the imaging surface are calculated through interpolation.

At this time, if the target pixel is at a position P (i, j) on the imaging surface, in step S214, the ratio of color mixture MRleft among the ratios of color mixture (MRleft and MRright) corresponding to the position i in the horizontal direction is read.

Subsequently, the pixel value (Ro) of the R pixel on the left side of the target pixel is acquired from the RAW data (step S216).

Next, the ratio of color mixture MRleft, which is read in step S214, is multiplied by a pixel value acquired in step S216, and the amount of color mixture Mleft (=RoxMRleft) from the left side to the right side is calculated (step S218).

In steps S220, S230, and S240, in a manner similar to that in step S210 (steps S212 to S218) of calculating the amount of color mixture from the left side to the right side, the amount of color mixture from the right side to the left side is calculated, the amount of color mixture from the upper side to the lower side is calculated, and the amount of color mixture from the lower side to the upper side is calculated.

As described above, if the G pixel as a correction target is Gr, in steps S210 and S220, the amounts of color mixture respectively from the left and right sides are calculated. In contrast, if the G pixel as a correction target is Gb, in steps S230 and S240, the amounts of color mixture respectively from the upper and lower sides are calculated.

In step S250, by subtracting the amount of color mixture calculated for each of the directions of the color mixture from the pixel value of the target pixel, color mixture correction that removes the amount of color mixture from the pixel value of the target pixel is performed.

Subsequently, it is determined whether or not color mixture correction for all the target pixels of the RAW data is terminated (step S260). If it is determined that the correction is not terminated (if "No"), the process advances to step S200. Thereby, color mixture correction is performed on the pixel value of another target pixel. In contrast, if it is determined that the color mixture correction for all the target pixels is terminated (if "Yes"), the current color mixture correction processing is terminated.

Figure 18:
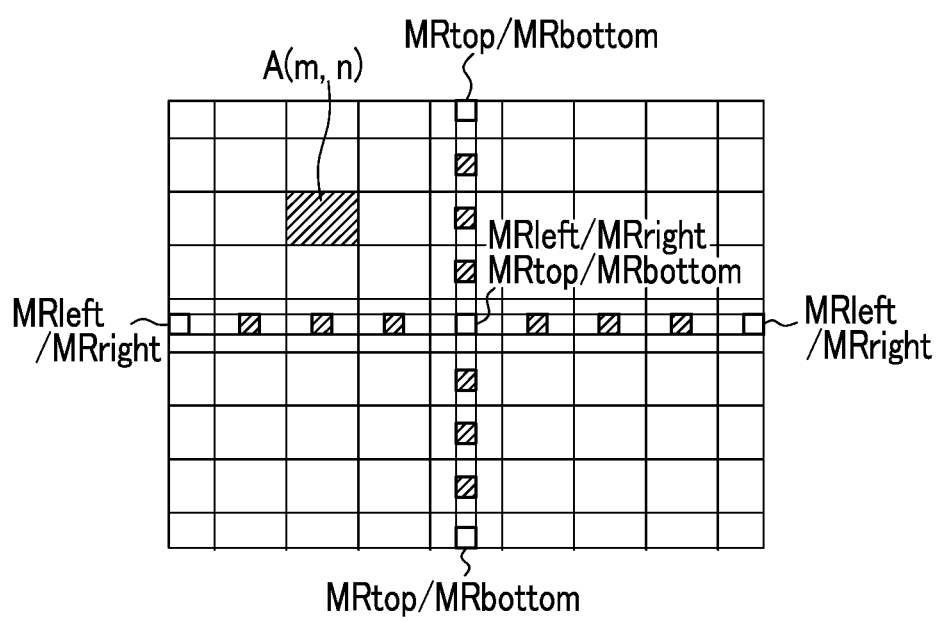
FIG. 18 is a diagram illustrating relationships between the ratio of color mixture used for a pixel within a segmented region of the imaging surface and the separate ratios of color mixture according to the directions of the color mixture stored in accordance with positions in the segmented region of the imaging surface.

As shown in FIG. 18, the memory 37 may discretely store the ratios of color mixture (MRleft, MRright, MRtop, and MRbottom) corresponding to the segmented regions which are obtained by segmenting the imaging surface, and may use the same ratios of color mixture corresponding to the segmented regions for the target pixels within the segmented regions. For example, in a segmented region A (m, n), for the G pixels Gr affected by the color mixture from the left and right sides, the ratios of color mixture (MRleft and MRright) in the left and right directions are commonly used, where the ratios are stored to correspond to a position m of the segmented region A (m, n). In addition, for the G pixels Gb affected by the color mixture from the upper and lower sides, the ratios of color mixture (MRtop and MRbottom) in the up and down directions are commonly used, where the ratios are stored to correspond to a position n of the segmented region A (m, n).

The embodiment described the example of the color imaging element having the Bayer array, but in the case of the color imaging element having the new CF array, the color mixture from the R pixels occurs in the B pixels and the G pixels.

If the pixels as targets of color mixture correction are B pixels, the ratio of color mixture calculated for each B pixel can be used. If the pixels as targets of color mixture correction are G pixels, among the ratios of color mixture calculated for each B pixel, the ratio of color mixture in the most similar or same direction of the color mixture can be used. In addition, only one pixel among four pixels, which are adjacent to each of 2×2 G pixels in the color imaging element having the new CF array in the up, down, left, and right directions, is the R pixel. Hence, the ratio of color mixture calculated on the basis of the output of the G pixel and the output of the R pixel adjacent to the G pixel may be used.

[Example of Comparison Between the Present Invention and Related Art]

A and B of the graph shown in FIG. 19 respectively indicate an amount of color mixture from the R pixel on the left side to the pixel on the right side, and an amount of color mixture from the R pixel on the right side to the pixel on the left side, relative to the position in the imaging surface as a variable, when uniform red light is incident onto a surface of the color imaging element. In FIG. 19, the center position of the imaging surface is set as 0, and the positions at the left and right end portions of the imaging surface are set as ±10.

C of the graph shown in FIG. 19 indicates a total amount of color mixture (A+B) from the left and right sides, and indicates an amount of color mixture which can be corrected through a new correction method 2 (third embodiment) according to the present invention.

D of the graph indicates an amount of color mixture according to the conventional method. The amount of color mixture is an absolute value (1A-B1) of an output difference between the left and right sides of the R pixel in the color imaging element having the Bayer array.

Figure 26:
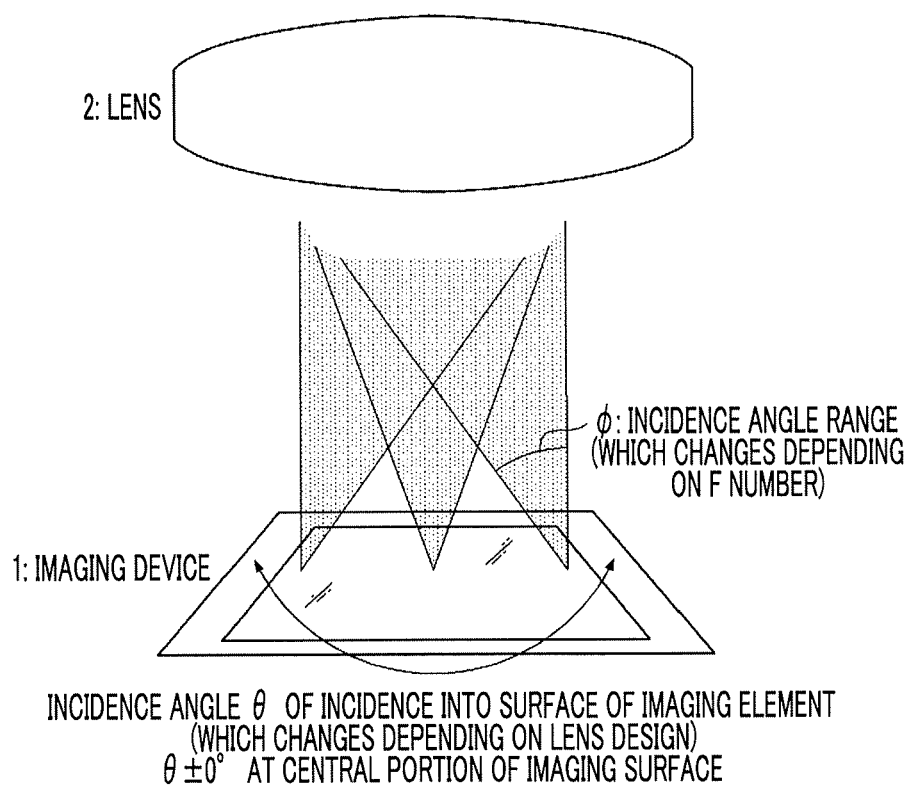
FIG. 26 is a diagram illustrating change in the amount of color mixture depending on an incidence angle and an incidence angle range.

As can be clearly seen from the comparison between C and D of the graph, in the conventional method, at the central portion within the imaging surface, the amount of color mixture is regarded as zero for the purpose of calculation, and the color mixture based on the incidence angle range φ shown in FIG. 26 is not considered.

Further, E of the graph indicates an amount of color mixture according to the correction method using a combination of the related arts. In the method, at the central portion of the imaging surface, the outputs of the G pixels, which are obtained when pure red light is incident, are regarded as indicating color mixture, thereby calculating the ratio of color mixture. In addition, at the end portions of the imaging surface, in a manner similar to the conventional method, calculation of the ratio of color mixture is performed using the difference between the left and right, and linear interpolation is performed on a region between the central portion and the end portions of the imaging surface. In this method, at the end portions of the imaging surface, the color mixture from the opposite side is regarded as zero. However, as shown in A and B of the graph, even at the end portions of the imaging surface, the color mixture from the opposite side occurs, and thus the amount of color mixture is not correct.

F of the graph indicates an amount of color mixture which is corrected by a new correction method 1 (first, second embodiment) according to the present invention. In particular, F of the graph indicates the following case. At the central portion of the imaging surface and the left and right end portions of the imaging surface, each amount of color mixture is set as the total amount of color mixture (A+B) from the left and right sides. The amount of color mixture between the central portion of the imaging surface and the left and right end portions of the imaging surface is set as the amount of color mixture which is obtained by performing linear interpolation on the total amount of color mixture at the central portion and the total amounts of color mixture at the end portions of the imaging surface.

As can be clearly seen from the comparison between C, F and E of the graph, there is a big difference between the amounts of color mixture at the end portions of the imaging surface. Consequently, in E of the graph, the amount of color mixture from the opposite side at the end portions of the imaging surface is regarded as zero, and thus an error thereof is correspondingly large relative to the original amount of color mixture.

FIG. 20 is a table showing numerical value data of A to F of the graph shown in FIG. 19.

F of the graph indicates a total amount of color mixture which is calculated on the basis of a ratio of color mixture which is obtained by performing linear interpolation on the separate ratios of color mixture according to the left and right directions at the center of the imaging surface and the end portions of the imaging surface. However, by performing quadratic interpolation, F of the graph becomes approximate to C of the graph.

Figure 21:
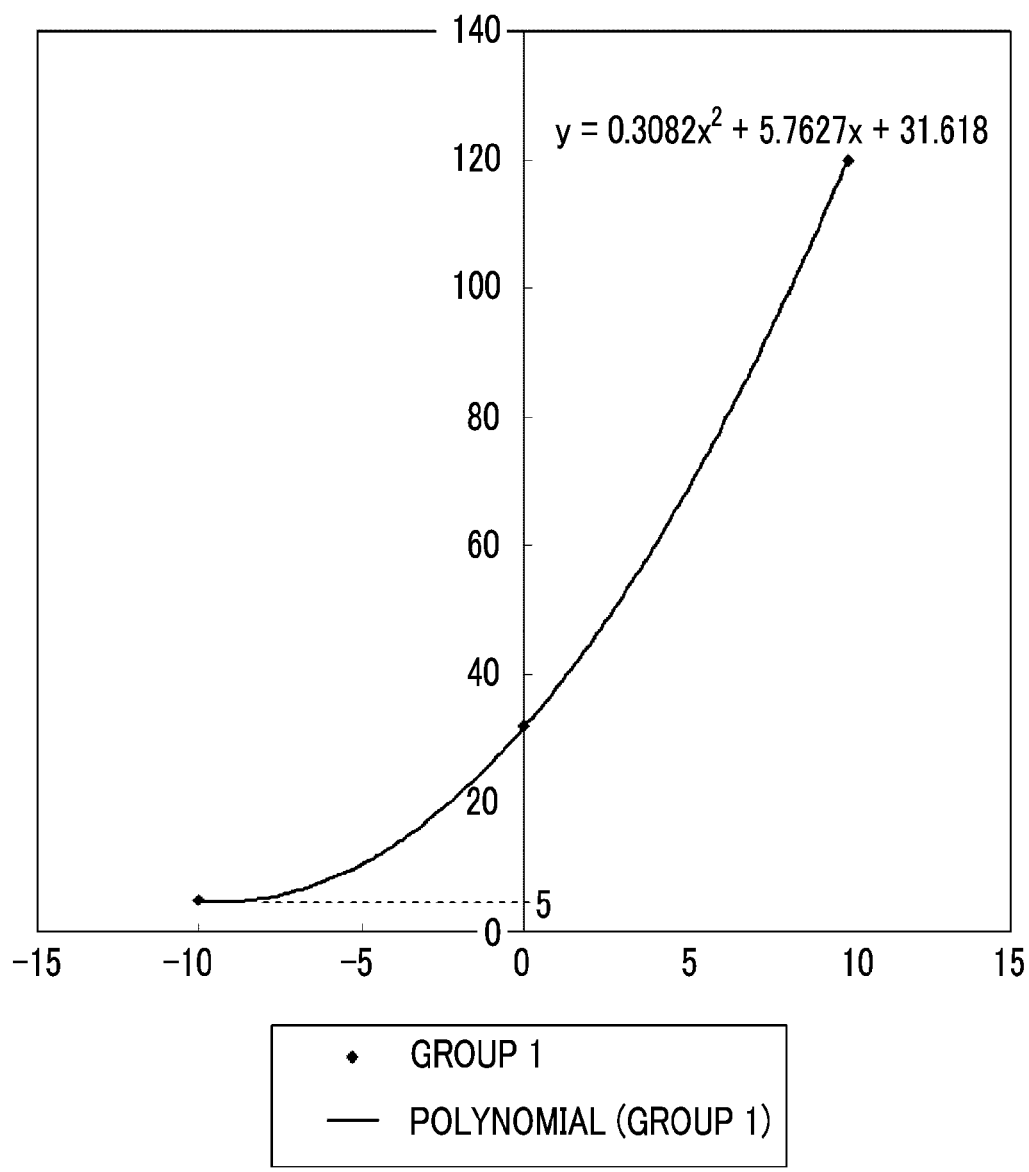
FIG. 21 is a graph illustrating an amount of color mixture calculated from the ratio of color mixture which is obtained through quadratic interpolation performed on the ratios of color mixture from the left side and to the right side at both end portions of the imaging surface and the center of the imaging surface.

FIG. 21 is a graph illustrating an amount of color mixture calculated from the ratio of color mixture which is obtained through quadratic interpolation performed on the ratios of color mixture from the left side and to the right side at both end portions of the imaging surface and the center of the imaging surface. A curve in the graph is approximate to A of the graph shown in FIG. 19.

Figure 22:
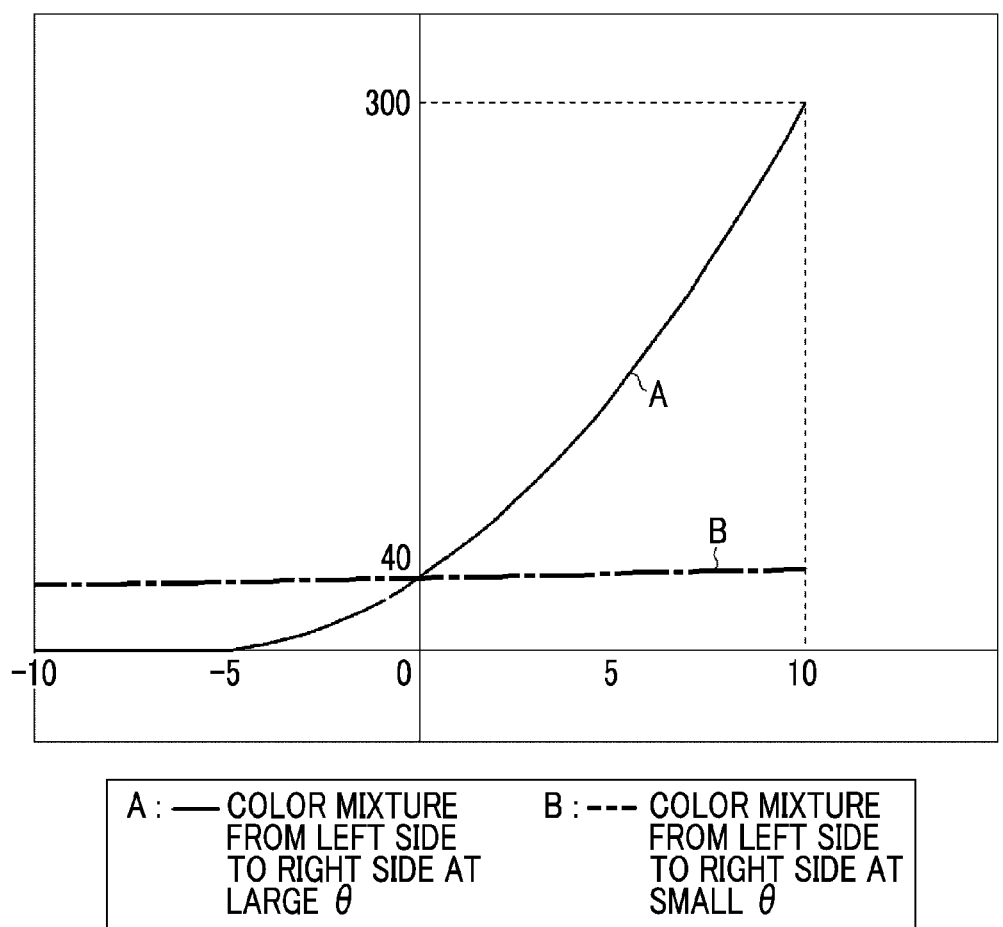
FIG. 22 is a graph illustrating an amount of color mixture when an amount of change in the incidence angle θ between the center and the end portions of the imaging surface is large, and illustrating an amount of color mixture when the amount of change is small.

FIG. 22 is a graph illustrating an amount of color mixture when an amount of change in the incidence angle θ between the center and the end portions of the imaging surface is large, and illustrating an amount of color mixture when the amount of change is small. Further, FIG. 23 is a table showing numerical value data of the graph shown in FIG. 22.

If a zoom ratio of the photography lens 20 is small (in a case of a wide angle mode), the amount of change in the incidence angle θ between the center and the end portions of the imaging surface is large, and the amount of color mixture greatly changes in accordance with the position on the imaging surface, as shown in A of the graph. In contrast, if the zoom ratio of the photography lens 20 is large (in a case of a telephoto mode), the amount of change in the incidence angle θ between the center and the end portions of the imaging surface decreases, and the amount of color mixture does not greatly change as shown in B of the graph.

For example, the amounts of color mixture at the center of the imaging surface of A and B of the graph are indicated as the same value of 40. However, at A of the graph, the amount of color mixture from the left side to the right side in the range of −5 to −10 on the left side of the graph is zero, and the amount of color mixture from the left side to the right side at the right end of the graph is 300.

In contrast, at B of the graph, relative to the amount of color mixture of 40 at the center of the imaging surface, the change in the amount of color mixture at the left and right end portions of the imaging surface is only about ±5.

Such a change in the amount of color mixture (ratio of color mixture) depends on not only the zoom ratio of the photography lens 20 but also the F number. The color-mixture-ratio calculation device 10 (FIG. 1) calculates a ratio of color mixture for each photography condition while changing the zoom ratio and the F number of the photography lens 20 through the photography condition setting section 15, and stores the ratio of color mixture for each photography condition in the memory 37 of the imaging device 50. Thereby, it is possible to perform color mixture correction appropriate for the photography conditions.

[Another Embodiment of Imaging Device]

The data, which is stored in the ROM area of the memory 37 of the imaging device 50 of the embodiment and indicates the ratios of color mixture for color mixture correction according to the present invention, is calculated by the color-mixture-ratio calculation device 10 shown in FIG. 1, but the present invention is not limited to this. By making the imaging device 50 have a function the same as that of the color-mixture-ratio calculation device 10, the imaging device 50 may calculate the ratios of color mixture, and may store the calculation result in the ROM area of the memory 37.

In particular, when a new lens unit as the interchangeable lens unit 54 of which the ratio of color mixture is not stored is mounted on the camera main body 52, it is preferable that the ratio of color mixture is calculated through the function the same as that of the color-mixture-ratio calculation device 10 built into the camera main body 52 at the time of mounting the lens unit, and the calculation result is stored in the memory 37 in association with the lens unit.

The above-mentioned embodiment described the imaging device 50 having the interchangeable lens unit 54, but the configuration of the imaging device is not limited to this, and the imaging device may be a lens-integrated-type imaging device. Further, as another imaging device to which the present invention can be applied, for example, a built-in-type or an external-type camera for a PC, or a portable terminal apparatus having a photography function to be described later can be used.

Examples of the portable terminal apparatus which is an embodiment of the imaging device of the present invention include a mobile phone, a smartphone, a personal digital assistant (PDA), and a portable game machine. Hereinafter, a detailed description will be given of an example of a smartphone with reference to the accompanying drawings.

<Configuration of Smartphone>

Figure 24:
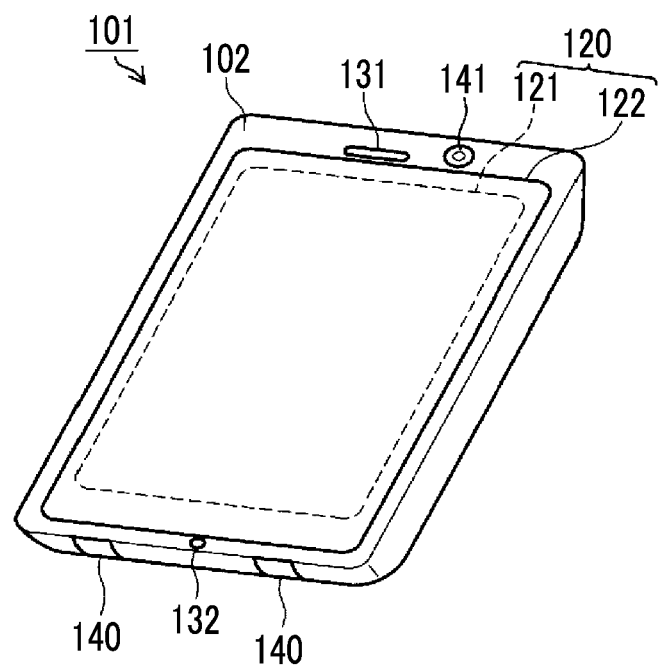
FIG. 24 is an external view of a smartphone as another embodiment of the imaging device.

FIG. 24 shows an appearance of a smartphone 101 as the imaging device according to an embodiment of the present invention. The smartphone 101 shown in FIG. 24 includes: a casing 102 that has a flat plate shape; a display panel 121 as a display section on one side of the casing 102; and a display input section 120 into which an operation panel 122 as an input section is integrated. Further, the casing 102 includes a speaker 131, a microphone 132, operation sections 140, and a camera section 141. It should be noted that the configuration of the casing 102 is not limited to this. For example, it may be possible to adopt a configuration in which the input section and the display section are independent, or it may be possible to adopt a configuration having a slide mechanism or a folded structure.

Figure 25:
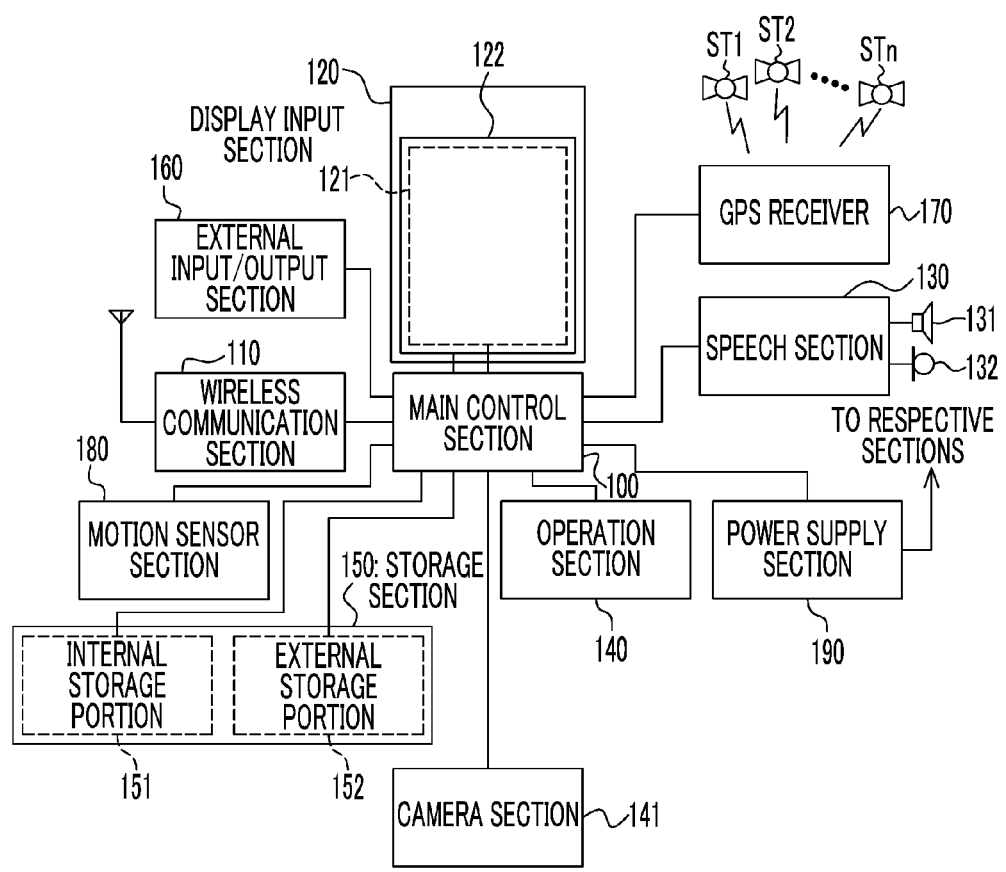
FIG. 25 is a block diagram illustrating a configuration of a main section of the smartphone.

FIG. 25 is a block diagram illustrating a configuration of the smartphone 101 shown in FIG. 24. As shown in FIG. 25, the smartphone includes, as main components, a wireless communication section 110, a display input section 120, a speech section 130, the operation sections 140, the camera section 141, a storage section 150, an external input/output section 160, a global positioning system (GPS) receiver 170, a motion sensor section 180, a power supply section 190, and a main control section 100. Further, as the main function of the smartphone 101, there is provided a wireless communication function for performing mobile wireless communication with a base station device BS through a mobile communication network NW.

The wireless communication section 110 performs wireless communication with the base station device BS, which is included in the mobile communication network NW, in accordance with an instruction of the main control section 100. Using such wireless communication, various kinds of file data such as audio data and image data, e-mail data, and the like are transmitted and received, and Web data, streaming data, and the like are received.

The display input section 120 is a so-called touch panel, and includes the display panel 121 and the operation panel 122. The touch panel displays image (still image and moving image) information or text information so as to visually transfer the information to a user in accordance with control of the main control section 100, and detects a user operation on the displayed information.

The display panel 121 uses a liquid crystal display (LCD), an organic electro-luminescence display (OELD), or the like as a display device. The operation panel 122 is a device that is provided to view an image which is displayed on a display screen of the display panel 121 and that detects a single pair of coordinates or a plurality of pairs of coordinates at which an operation is performed by a user's finger or a stylus. When such a device is operated by a user's finger or a stylus, the device outputs a detection signal, which is generated due to the operation, to the main control section 100. Subsequently, the main control section 100 detects an operation position (coordinates) on the display panel 121, on the basis of the received detection signal.

As shown in FIG. 24, the display panel 121 and the operation panel 122 of the smartphone 101, which is exemplified as the imaging device according to the embodiment of the present invention, are integrated, constitute the display input section 120, and are disposed such that the operation panel 122 completely covers the display panel 121. When such an arrangement is adopted, the operation panel 122 may have a function of also detecting a user operation in a region other than the display panel 121. In other words, the operation panel 122 may include a detection region (hereinafter referred to as a display region) for a part which overlaps with the display panel 121 and a detection region (hereinafter referred to as a non-display region) for the other part at the outer edge which does not overlap with the display panel 121.

It should be noted that a size of the display region and a size of the display panel 121 may completely coincide with each other, but it is not always necessary for both to coincide with each other. Further, the operation panel 122 may include two sensing regions of the outer edge part and the other inside part. Furthermore, a width of the outer edge part is appropriately designed depending on a size of the casing 102 and the like. In addition, examples of the position detection method adopted by the operation panel 122 may include a matrix switch method, a resistance film method, a surface elastic wave method, an infrared method, an electromagnetic induction method, and an electrostatic capacitance method, and the like, and any method may be adopted.

The speech section 130 includes a speaker 131 and a microphone 132. The speech section 130 converts a sound of a user, which is input through the microphone 132, into sound data, which can be processed in the main control section 100, and outputs the data to the main control section 100, or decodes sound data, which is received by the wireless communication section 110 or the external input/output section 160, and outputs the data from the speaker 131. Further, as shown in FIG. 24, for example, the speaker 131 can be mounted on a surface the same as the surface on which the display input section 120 is provided, and the microphone 132 can be mounted on a side surface of the casing 102.

The operation sections 140 are hardware keys using key switches or the like, and receive an instruction from a user. For example, as shown in FIG. 24, the operation sections 140 are button type switches which are mounted on the side surface of the casing 102 of the smartphone 101. Each switch is turned on if it is pressed by a finger or the like, and is turned off due to restoring force of a spring if the finger is released.

The storage section 150 stores a control program and control data of the main control section 100, application software, address data in which names, phone numbers, and the like of communication partners are associated, received and transmitted e-mail data, Web data which is downloaded by Web browsing, and downloaded contents data, and temporarily stores streaming data and the like. Further, the storage section 150 is constituted of an internal storage portion 151, which is built into the smartphone, and an external storage portion 152 which has a removable external memory slot. In addition, each of the internal storage portion 151 and the external storage portion 152 constituting the storage section 150 is implemented by using a storage medium such as a flash memory type, a hard disk type, a multimedia card micro type, a card type memory (such as a Micro SD (registered trademark) memory), a random access memory (RAM), or a read only memory (ROM).

The external input/output section 160 has a function of an interface with all external devices connected to the smartphone 101. The external input/output section 160 is for communication (such as universal serial bus (USB) or IEEE1394) with other external devices, direct or indirect connection to networks (such as the Internet, wireless LAN, Bluetooth (registered trademark), radio frequency identification (RFID), infrared communication (Infrared Data Association: IrDA) (registered trademark), ultrawideband (UWB) (registered trademark), and ZigBee (registered trademark)), or the like.

Examples of the external devices connected to the smartphone 101 include a wired/wireless headset, a wired/wireless external charger, a wired/wireless data port, a memory card which is connected through a card socket, a subscriber identity module (SIM) or user identity module (UIM) card, external audio and video devices which are connected through audio and video input/output (I/O) terminals, external audio and video devices which are connected in a wireless manner, a smartphone which is connected in a wired or wireless manner, a personal computer which is connected in a wired or wireless manner, a PDA which is connected in a wired or wireless manner, a personal computer which is connected in a wired or wireless manner, an earphone, and the like. The external input/output section is able to transfer the data, which is transmitted from such external devices, to the components within the smartphone 101, and to transmit the data within the smartphone 101 to the external devices.

The GPS receiver 170 receives a plurality of GPS signals, which are transmitted from GPS satellites ST1 to STn, in accordance with instructions of the main control section 100, executes positioning calculation processing based on the received GPS signals, and detects a position formed of a latitude, a longitude, and an altitude of the smartphone 101. The GPS receiver 170 may detect the position by using position information when it is possible to acquire the position information from the wireless communication section 110 or the external input/output section 160 (for example, wireless LAN).

The motion sensor section 180 includes, for example, a triaxial acceleration sensor, and detects physical movement of the smartphone 101, in accordance with an instruction of the main control section 100. By detecting physical movement of the smartphone 101, a speed of acceleration and a direction of the movement of the smartphone 101 are detected. Such a detection result is output to the main control section 100.

The power supply section 190 supplies the respective sections of the smartphone 101 with electric power, which is stored in a battery (not shown), in accordance with an instruction of the main control section 100.

The main control section 100 includes a micro processor, and integrally controls the respective sections of the smartphone 101 by performing an operation on the basis of control data or a control program stored in the storage section 150. Further, the main control section 100 has an application processing function and a mobile communication control function of controlling the respective sections of a communication system in order to perform data communication and sound communication through the wireless communication section 110.

The application processing function is implemented by an operation of the main control section 100 using application software stored in the storage section 150. Examples of the application processing function include: an infrared communication function of performing data communication with other devices by controlling the external input/output section 160; an e-mail function of transmitting and receiving e-mails; a Web browsing function of browsing Web pages; and the like.

Further, the main control section 100 has an image processing function of displaying a video on the display input section 120 and the like, on the basis of image data (still image and moving image data) such as received data and downloaded streaming data. The image processing function means a function of causing the main control section 100 to decode the image data, apply image processing to the corresponding decoding result, and display an image on the display input section 120.

Further, the main control section 100 executes display control for the display panel 121 and operation detection control to detect the user operation through the operation sections 140 and the operation panel 122.

Through execution of the display control, the main control section 100 displays an icon for activating application software and a window for displaying a software key such as a scroll bar or creating an e-mail. It should be noted that the scroll bar means a software key for receiving an instruction to move a display portion of an image on a large image which cannot be entirely shown in the display region of the display panel 121.

Further, through execution of the operation detection control, the main control section 100 detects the user operation performed through the operation section 140, receives an operation performed on the icon or a text input performed in an input field of the window through the operation panel 122, or receives a request to scroll a displayed image through the scroll bar.

Furthermore, the main control section 100 has a touch panel control function performed through execution of the operation detection control. The function determines whether the operation position of the operation panel 122 is in the overlapping part (display region) which overlaps with the display panel 121 or the other part (non-display region) at the outer edge which does not overlap with the display panel 121, and controls the display position of the software key or the sensing region of the operation panel 122.

In addition, the main control section 100 may detect a gesture operation performed on the operation panel 122, and may execute a preset function in response to the detected gesture operation. The gesture operation is not a simple touch operation used in the past. The gesture operation means an operation for drawing a locus with a finger or the like, an operation of specifying a plurality of positions at the same time, or an operation of drawing loci from a plurality of positions to at least one position as a combination of the above-mentioned operations.

The camera section 141 is a digital camera for performing electronic photography by using the imaging element such as a complementary metal oxide semiconductor (CMOS) or a charge-coupled device (CCD). The above-mentioned imaging device 50 can be applied to the camera section 141. That is, under control of the main control section 100, the camera section 141 performs signal processing on the RAW data which is obtained through image capturing. The signal processing includes offset correction, color mixture correction, white balance correction, gamma correction, demosaic processing (synchronization processing), RGB/YC conversion processing, and the like. However, the camera section 141 performs color mixture correction of the RAW data subjected to the offset correction, by using the separate ratios of color mixture according to the directions of the color mixture stored in the internal storage portion 151 at the time of color mixture correction.

Further, the camera section 141 is able to convert luminance data (Y) and color difference data (Cr, Cb), which are converted through the RGB/YC conversion processing, into compressed image data such as data of a joint photographic coding experts group (JPEG), and to record the data in the storage section 150 or to output the data through the external input/output section 160 or the wireless communication section 110. As shown in FIG. 24, in the smartphone 101 the camera section 141 is mounted on the same side as the display input section 120. However, the mounting position of the camera section 141 is not limited to this. The camera section 141 may be mounted on the rear side of the display input section 120, or a plurality of camera sections 141 may be mounted. In addition, in the case where the plurality of camera sections 141 is mounted, photography may be performed using a single camera section 141 by selecting the camera section 141 for the photography, or photography may be performed using the plurality of camera sections 141 at the same time.

Further, the camera section 141 can be used in various functions of the smartphone 101. For example, an image, which is acquired by the camera section 141, can be displayed on the display panel 121, and an image of the camera section 141 as one of the operation inputs of the operation panel 122 can be used. Further, when the GPS receiver 170 detects a position, the GPS receiver 170 may detect the position with reference to the image acquired from the camera section 141. Furthermore, it may be possible to determine a direction of optical axis of the camera section 141 of the smartphone 101 or determine a current user environment, using the GPS receiver 170 in combination with the triaxial acceleration sensor or without using the triaxial acceleration sensor, with reference to the image acquired from the camera section 141. Needless to say, the image acquired from the camera section 141 may be used in the application software.

Otherwise, the position information acquired by the GPS receiver 170, the sound information acquired by the microphone 132 (or text information obtained through sound text conversion performed by the main control section or the like), the posture information acquired by the motion sensor section 180, and the like may be added to the image data of the still image or the moving image, and the image data may be recorded in the storage section 150, or may be output through the external input/output section 160 or the wireless communication section 110.

[Others]

The above-mentioned embodiment described the case where the pixels of the color imaging element are arranged in a square lattice shape, but the present invention can be applied to a case where the pixels of the color imaging element are arranged in a diagonal lattice shape. When the pixels of the color imaging element are arranged in a square lattice shape, the directions of the color mixture, in which color mixture occurs between pixels, are the four directions of up, down, left, and right directions in which the pixels are adjacent at the shortest distance. However, when the pixels of the color imaging element are arranged in a diagonal lattice shape, the directions of the color mixture are the four directions of a diagonal upper right direction, a diagonal lower right direction, a diagonal upper left direction, and a diagonal lower left direction in which the pixels are adjacent at the shortest distance. Accordingly, when the pixels of the color imaging element are arranged in a diagonal lattice shape, it is necessary to calculate the separate ratios of color mixture according to the diagonal directions of the color mixture.

The color imaging element of the present embodiment having the color filter array formed of color filters with primary colors RGB was described. However, the present invention can also be applied to a color imaging element that has a filter array formed of color filters with four colors including different color filters with one or more colors of white, emerald, yellow, and the like added to the primary colors RGB.

EXPLANATION OF REFERENCES 5, 5A: optical black section (OB section)
6: opening
10: color-mixture-ratio calculation device
11: RAW data acquisition section
12: color-mixture-ratio calculation section
13: interpolation processing section
14: storage section
15: photography condition setting section
16, 30: CPU
20: photography lens
23: aperture stop
27: color imaging element
32: signal processing section
37: memory
50: imaging device
52: camera main body
54: lens unit (interchangeable lens)
60: red light emitting section
101: smartphone
141: camera section

What is claimed is:

1. An imaging device that calculates ratios of color mixture of a single-plate-type color imaging element having color pixels of at least three colors of red, green, and blue, the imaging device comprising:
a processor configured to:
acquire outputs of pixels prior to color-mixture correction from the color imaging element when red light is incident onto the color imaging element through a photography lens; and
calculate the ratios of color mixture when outputs of pixels adjacent to red pixels among the outputs of the pixels acquired are regarded as components of color mixture caused by the red pixels,
wherein the processor calculates the ratio of color mixture independent of the directions of the color mixture caused by the red pixels at least at a central portion of an imaging surface of the color imaging element, and respectively calculates the separate ratios of color mixture according to the directions of the color mixture caused by the red pixels at end portions of the imaging surface of the color imaging element, and
wherein the processor generates an image based on the calculated ratio of color mixture.

2. The imaging device according to claim 1,
wherein the color imaging element has green pixels which are adjacent to the red pixels and are arranged symmetrically in the directions of the color mixture, and
wherein the processor calculates the ratio of color mixture, on the basis of outputs of the red pixels at the central portion of the imaging surface and outputs of the green pixels adjacent to the corresponding red pixels, and calculates the separate ratios of color mixture according to the directions of the color mixture at the end portions of the imaging surface, on the basis of outputs of the red pixels at the end portions of the imaging surface and outputs of the green pixels adjacent to the corresponding red pixels, outputs of pixels of an optical black section adjacent to the red pixels of the color imaging element, or outputs of the green pixels adjacent to the optical black section.

3. The imaging device according to claim 1,
wherein the color imaging element has green pixels, which are adjacent to the red pixels and are arranged symmetrically in the directions of the color mixture, and a red pixel for the color-mixture-ratio calculation which has an opening in an optical black section, and
wherein the color-mixture-ratio calculation section calculates the ratio of color mixture at the central portion of the imaging surface, on the basis of outputs of the red pixels at the central portion of the imaging surface and outputs of the green pixels adjacent to the corresponding red pixels, and calculates the separate ratios of color mixture according to the directions of the color mixture at the end portions of the imaging surface, on the basis of an output of the red pixel for the color-mixture-ratio calculation and outputs of the pixels adjacent to the corresponding red pixel for the color-mixture-ratio calculation in the optical black section.

4. The imaging device according to claim 1, wherein the processor has an interpolation processor which calculates the separate ratios of color mixture according to the directions of the color mixture for each segmented region or for each pixel position of the imaging surface through interpolation, on the basis of the calculated ratios of color mixture at the central portion of the imaging surface and the calculated separate ratios of color mixture according to the directions of the color mixture at the end portions of the imaging surface.

5. The imaging device according to claim 2, wherein the processor has an interpolation processor which calculates the separate ratios of color mixture according to the directions of the color mixture for each segmented region or for each pixel position of the imaging surface through interpolation, on the basis of the calculated ratios of color mixture at the central portion of the imaging surface and the calculated separate ratios of color mixture according to the directions of the color mixture at the end portions of the imaging surface.

6. The imaging device according to claim 3, wherein the color-mixture-ratio calculation section has an interpolation processing section which calculates the separate ratios of color mixture according to the directions of the color mixture for each segmented region or for each pixel position of the imaging surface through interpolation, on the basis of the calculated ratios of color mixture at the central portion of the imaging surface and the calculated separate ratios of color mixture according to the directions of the color mixture at the end portions of the imaging surface.

7. The imaging device according to claim 1,
wherein the color imaging element has different color pixels which are not the red pixels and are adjacent to the red pixels and to which the red pixels are adjacent only in any one of a plurality of the directions of the color mixture, and
wherein the color-mixture-ratio calculation section calculates the ratio of color mixture from the direction in which the red pixels are adjacent, at each pixel position of the different color pixels, on the basis of an output of the color pixel at the corresponding pixel position and an output of one red pixel adjacent to the corresponding color pixel.

8. The imaging device according to claim 7, wherein the color imaging element has blue pixels which are adjacent to the red pixels and to which the red pixels are adjacent only in any one of the plurality of the directions of the color mixture.

9. The imaging device according to claim 7, wherein the plurality of the directions of the color mixture is four directions in which the pixels on the color imaging element are adjacent at a shortest distance.

10. The imaging device according to claim 8, wherein the plurality of the directions of the color mixture is four directions in which the pixels on the color imaging element are adjacent at a shortest distance.

11. The imaging device according to claim 1, further comprising a photography condition setting processor that changes at least either one of a focal length or an F number of an aperture stop of the photography lens,
wherein the processor acquires the outputs of the pixels prior to color-mixture correction from the corresponding color imaging element when red light is incident onto the color imaging element, whenever a photography condition is changed by the photography condition setting processor, and
wherein the processor calculates the ratios of color mixture on the basis of the outputs of the pixels acquired whenever the photography condition is changed by the photography condition setting processor.

12. The imaging device according to claim 2, further comprising a photography condition setting processor that changes at least either one of a focal length or an F number of an aperture stop of the photography lens,
wherein the processor acquires the outputs of the pixels prior to color-mixture correction from the corresponding color imaging element when red light is incident onto the color imaging element, whenever a photography condition is changed by the photography condition setting processor, and
wherein the processor calculates the ratios of color mixture on the basis of the outputs of the pixels acquired whenever the photography condition is changed by the photography condition setting processor.

13. The imaging device according to claim 3, further comprising a photography condition setting section that changes at least either one of a focal length or an F number of an aperture stop of the photography optical system,
wherein the acquisition section acquires the outputs of the pixels prior to color-mixture correction from the corresponding color imaging element when red light is incident onto the color imaging element, whenever a photography condition is changed by the photography condition setting section, and
wherein the color-mixture-ratio calculation section calculates the ratios of color mixture on the basis of the outputs of the pixels acquired by the acquisition section whenever the photography condition is changed by the photography condition setting section.

14. The imaging device according to claim 1, further comprising:
an image capturing section that includes the photography lens and the color imaging element;
a memory that stores ratios of color mixture calculated by the imaging device; and
a processor configured to:
calculate color mixture components on the basis of the ratios of color mixture stored in the memory and output of pixels prior to color-mixture correction acquired from the color imaging element at the time of photography so as to remove the color mixture components calculated from the outputs of the pixels prior to color-mixture correction.

15. The imaging device according to claim 11, further comprising:
an image capturing section that includes the photography lens and the color imaging element;
a memory that stores ratios of color mixture, which are calculated by the imaging device, in association with a photography condition which is set by the photography condition setting processor; and
a processor configured to:
read the corresponding ratios of color mixture from the ratios of color mixture stored in the memory on the basis of the photography condition at the time of photography, and calculate color mixture components on the basis of the read ratios of color mixture outputs of pixels prior to color-mixture correction acquired from the color imaging element at the time of the corresponding photography so as to remove the color mixture components calculated from the outputs of the pixels prior to color-mixture correction.

16. The imaging device according to claim 1, further comprising:
an image capturing section that includes the photography lens and the color imaging element;
memory that stores ratios of color mixture calculated by the imaging device at the time of ratio of color mixture setting; and
a processor configured to:
calculate color mixture components on the basis of the ratios of color mixture stored in the memory and output of pixels prior to color-mixture correction acquired from the color imaging element at the time of photography so as to remove the color mixture components calculated from the outputs of the pixels prior to color-mixture correction.

17. The imaging device according to claim 11, further comprising:
an image capturing section that includes the photography lens and the color imaging element;
memory that stores ratios of color mixture, which are calculated by the imaging device at the time of ratio of color mixture setting, in association with a photography condition which is set by the photography condition setting processor; and a processor configured to:

read the corresponding ratios of color mixture from the ratios of color mixture stored in the memory on the basis of the photography condition at the time of photography, and calculate color mixture components on the basis of the read ratios of color mixture outputs of pixels prior to color mixture correction acquired from the color imaging element at the time of the corresponding photography so as to remove the color mixture components calculated from the outputs of the pixels prior to color mixture correction.

18. The imaging device according to claim 16, wherein the photography lens is an interchangeable lens, and wherein the imaging device calculates the ratios of color mixture at the time of mounting at least a new interchangeable lens.

19. A color-mixture-ratio calculation method of calculating ratios of color mixture of a single-plate-type color imaging element having color pixels of at least three colors of red, green, and blue, using the imaging device according to claim 1, the color-mixture-ratio calculation method comprising:

making red light incident onto the color imaging element through a photography lens;

acquiring outputs of pixels prior to color-mixture correction from the color imaging element; and calculating the ratios of color mixture when outputs of pixels adjacent to red pixels among the acquired outputs of the pixels are regarded as components of color mixture caused by the red pixels, calculating the ratio of color mixture independent of the directions of the color mixture caused by the red pixels at least at a central portion of an imaging surface of the color imaging element, and respectively calculating the separate ratios of color mixture according to the directions of the color mixture caused by the red pixels at end portions of the imaging surface of the color imaging element.

20. The color-mixture-ratio calculation method according to claim 19, further comprising a photography condition setting step of changing at least either one of a focal length or an F number of an aperture stop of the photography lens, wherein in acquiring outputs of pixels prior to color-mixture correction from the color imaging element, the outputs of the pixels prior to color-mixture correction are acquired from the corresponding color imaging element when red light is incident onto the color imaging element, whenever a photography condition is changed through the photography condition setting step, and wherein in calculating the ratios of color mixture, the ratios of color mixture are calculated on the basis of the outputs of the pixels whenever the photography condition is changed through the photography condition setting step.

* * * * *